United States Patent
Lee et al.

(10) Patent No.: US 11,398,581 B2
(45) Date of Patent: Jul. 26, 2022

(54) SEMICONDUCTOR DEVICE

(71) Applicant: LG INNOTEK CO., LTD., Seoul (KR)

(72) Inventors: Sang Youl Lee, Seoul (KR); Chung Song Kim, Seoul (KR); Ji Hyung Moon, Seoul (KR); Sun Woo Park, Seoul (KR); Hyeon Min Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 86 days.

(21) Appl. No.: 16/761,008

(22) PCT Filed: Nov. 2, 2018

(86) PCT No.: PCT/KR2018/013262
§ 371 (c)(1),
(2) Date: May 1, 2020

(87) PCT Pub. No.: WO2019/088763
PCT Pub. Date: May 9, 2019

(65) Prior Publication Data
US 2021/0036187 A1 Feb. 4, 2021

(30) Foreign Application Priority Data

Nov. 2, 2017 (KR) .......................... 10-2017-0145507
Apr. 27, 2018 (KR) .......................... 10-2018-0048824

(51) Int. Cl.
*H01L 33/20* (2010.01)
*H01L 33/00* (2010.01)
(Continued)

(52) U.S. Cl.
CPC .......... *H01L 33/20* (2013.01); *H01L 25/0753* (2013.01); *H01L 25/167* (2013.01); *H01L 33/0066* (2013.01); *H01L 33/0093* (2020.05)

(58) Field of Classification Search
CPC ... H01L 33/20; H01L 25/0753; H01L 25/167; H01L 33/0066; H01L 33/0093; H01L 27/156; H01L 33/30
See application file for complete search history.

(56) References Cited

U.S. PATENT DOCUMENTS

2007/0102715 A1* 5/2007 Ko .......................... H01L 33/20
257/88
2012/0138995 A1* 6/2012 Hwang ................... H01L 33/20
257/98
(Continued)

FOREIGN PATENT DOCUMENTS

KR  10-1994-0003062 A  2/1994
KR  10-2007-0041151 A  4/2007
(Continued)

*Primary Examiner* — Su C Kim
(74) *Attorney, Agent, or Firm* — Birch, Stewart, Kolasch & Birch, LLP

(57) ABSTRACT

Disclosed is a semiconductor device including a semiconductor structure including a first semiconductor layer, a second semiconductor layer, and an active layer disposed between the first semiconductor layer and the second semiconductor layer, a first electrode electrically connected to the first semiconductor layer, and a second electrode electrically connected to the second semiconductor layer. The semiconductor structure includes a first upper surface on which the first semiconductor layer is exposed, a second upper surface on which the second semiconductor layer is disposed, an inclined surface connecting the first upper surface and the second upper surface, and a recess formed between the first upper surface and the inclined surface. The recess has a depth less than or equal to 30% of a vertical distance between the first upper surface and the second upper surface.

20 Claims, 14 Drawing Sheets

(51) Int. Cl.
*H01L 25/075* (2006.01)
*H01L 25/16* (2006.01)

(56) References Cited

U.S. PATENT DOCUMENTS

2012/0146086 A1* 6/2012 Yokobayashi .......... H01L 33/14
257/99
2019/0013439 A1 1/2019 Sung et al.

FOREIGN PATENT DOCUMENTS

| KR | 10-2009-0105462 A | 10/2009 |
| KR | 10-2013-0091022 A | 8/2013 |
| KR | 10-2015-0092619 A | 8/2015 |
| KR | 10-2017-0082889 A | 7/2017 |
| KR | 10-2017-0083253 A | 7/2017 |

* cited by examiner

SEMICONDUCTOR DEVICE

CROSS REFERENCE TO RELATED APPLICATIONS

This application is the National Phase of PCT International Application No. PCT/KR2018/013262, filed on Nov. 2, 2018, which claims priority under 35 U.S.C. 119(a) to Patent Application Nos. 10-2017-0145507, filed in the Republic of Korea on Nov. 2, 2017, and 10-2018-0048824, filed in the Republic of Korea on Apr. 27, 2018, all of which are hereby expressly incorporated by reference into the present application.

TECHNICAL FIELD

Embodiments relate to a semiconductor device, a semiconductor device array, and a manufacturing method thereof.

BACKGROUND ART

A light-emitting diode (LED) is a light-emitting device that emits light when an electric current is applied thereto. A light-emitting diode can emit light with high efficiency at a low voltage, thus significantly saving energy. Recently, the luminance problem of light-emitting diodes has been greatly mitigated, and thus light-emitting diodes are being applied to various types of apparatuses such as backlight units of liquid crystal displays, display boards, display apparatuses, and home appliances.

Semiconductor devices including compounds such as GaN and AlGaN have many merits such as wide and adjustable band gap energy and thus may be variously used as light-emitting elements, light-receiving elements, various kinds of diodes, or the like.

In particular, light-emitting elements such as a light-emitting diode or a laser diode using group III-V or II-VI compound semiconductor materials may implement various colors such as red, green, blue, and ultraviolet rays due to the development of thin-film growth technique and element materials and may implement efficient white light rays by using fluorescent materials or combining colors. These light-emitting elements also have advantages with respect to low power consumption, semi-permanent life span, fast response time, safety, and environmental friendliness compared to conventional light sources such as a fluorescent lamp, an incandescent lamp, or the like.

Recently, research has been conducted on a technique for manufacturing a light-emitting diode in a micro size and using the same as a pixel of a display. However, micro-sized light-emitting diodes have a problem of being susceptible to external impacts.

Also, micro-sized light-emitting diodes have another problem of being difficult to selectively separate from a wafer. In particular, defects occur when the light-emitting diodes are transferred to another substrate due to particles remaining when separation occurs.

DISCLOSURE

Technical Problem

Embodiments provide a semiconductor device resistant to external impacts.

Embodiments also provide a semiconductor device with improved optical output power.

Embodiments also provide a semiconductor device array that can be easily separated from a substrate and a method of manufacturing the same.

Embodiments also provide a semiconductor device array manufacturing method capable of preventing occurrence of particles during separation.

Problems to be solved in the embodiments are not limited thereto and include the following technical solutions and also objectives or effects understandable from the embodiments.

Technical Solution

According to an aspect of the present invention, there is provided a semiconductor device including a semiconductor structure including a first semiconductor layer, a second semiconductor layer, and an active layer disposed between the first semiconductor layer and the second semiconductor layer; a first electrode electrically connected to the first semiconductor layer; and a second electrode electrically connected to the second semiconductor layer, wherein the semiconductor structure includes a first upper surface on which the first semiconductor layer is exposed, a second upper surface on which the second semiconductor layer is disposed, an inclined surface connecting the first upper surface and the second upper surface, and a recess formed between the first upper surface and the inclined surface, and the recess has a depth less than or equal to 30% of a vertical distance between the first upper surface and the second upper surface.

The second semiconductor layer may include a first sub-semiconductor layer exposed from the first upper surface and a second sub-semiconductor layer disposed on the first sub-semiconductor layer, and a difference in etching rate between the first sub-semiconductor layer and the second sub-semiconductor layer may be less than or equal to 30% under the same etching conditions.

According to an embodiment of the present invention, there is provided a semiconductor device array including a substrate; a plurality of semiconductor structures disposed on the substrate; and an insulating layer disposed on the plurality of semiconductor structures, wherein the substrate includes a recess disposed between the plurality of semiconductor structures, the insulating layer includes a first insulating layer disposed on the plurality of semiconductor structures and a second insulating layer disposed on the recess, and the first insulating layer and the second insulating layer are connected to each other.

According to an embodiment of the present invention, there is provided a method of manufacturing a semiconductor device array, the method including forming a semiconductor structure layer on a first substrate; cutting the semiconductor structure layer into a plurality of semiconductors; forming an electrode on the plurality of semiconductor structures; and forming an insulating layer on the plurality of semiconductor structures, wherein the cutting includes forming a recess on the first substrate when the semiconductor structure layer is cut.

Advantageous Effects

According to an embodiment, it is possible to make a semiconductor device robust to external impacts. Accordingly, it is possible to solve a problem of a semiconductor being damaged during a transfer process.

Also, it is possible to manufacture a semiconductor element with improved optical output power.

Also, it is possible to prevent an insulating layer from being broken when a semiconductor device is being separated from a wafer.

Various advantageous merits and effects of the present invention are not limited to the above descriptions and will be easily understood while embodiments of the present invention are described in detail.

MODES OF THE INVENTION

The following embodiments may be modified or combined with each other, and the scope of the present invention is not limited to the embodiments.

Details described in a specific embodiment may be understood as descriptions associated with other embodiments unless otherwise stated or contradicted even if there is no description thereof in the other embodiments.

For example, when features of element A are described in a specific embodiment and features of element B are described in another embodiment, an embodiment in which element A and element B are combined with each other should be understood as falling within the scope of the present invention unless otherwise stated or contradicted even if not explicitly stated.

In the descriptions of embodiments, when an element is referred to as being above or under another element, the two elements may be in direct contact with each other, or one or more other elements may be disposed between the two elements. In addition, the term "above or under" used herein may represent a downward direction in addition to an upward direction with respect to one element.

Hereinafter, example embodiments will be described in detail with reference to the accompanying drawings so that they can be easily practiced by those skilled in the art.

Also, a semiconductor device package according to an embodiment of the present invention may include micro- or nano-sized semiconductor devices. Here, a small-sized semiconductor device may refer to a structural size of a semiconductor device. Also, a small-sized semiconductor device may have a size of 1 μm to 10 μm. Also, semiconductor devices according to embodiments may have a size of 30 μm to 60 μm, but the present invention is not limited thereto. Also, technical features or aspects of embodiments may be applied to a semiconductor device on a smaller scale.

Figure 1:
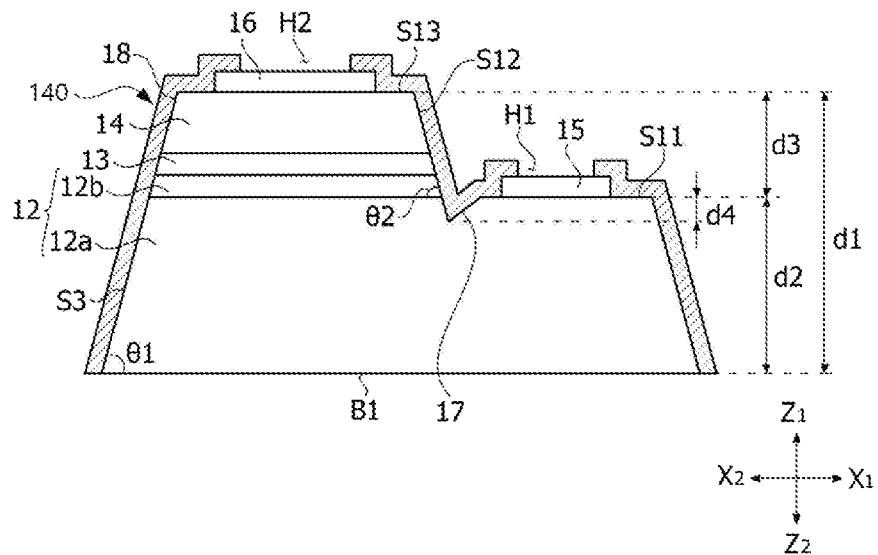
FIG. 1 is a sectional view of a semiconductor device according to an embodiment of the present invention.
Figure 2:
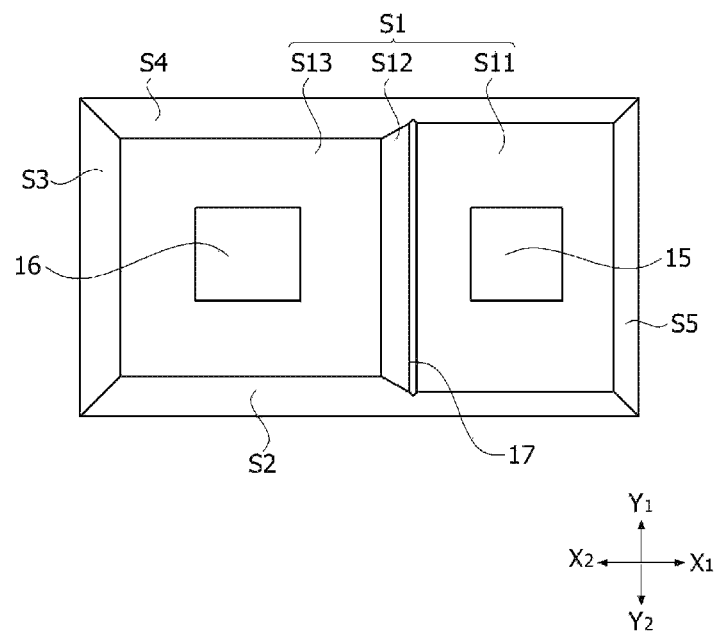
FIG. 2 is a plan view of a semiconductor device according to an embodiment of the present invention.
Figure 3A:
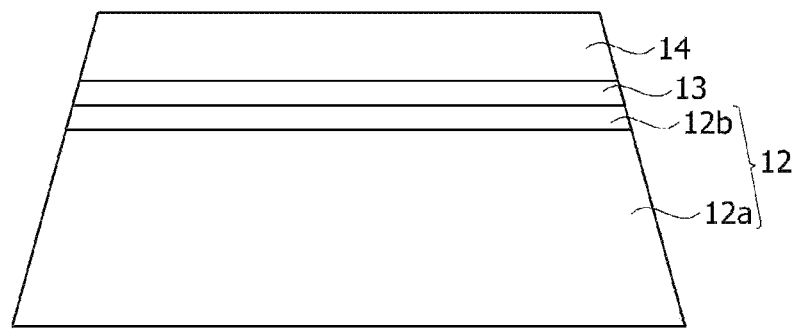
FIGS. 3A to 3C are diagrams for describing a reason why a recess of FIG. 1 is formed.
Figure 3B:
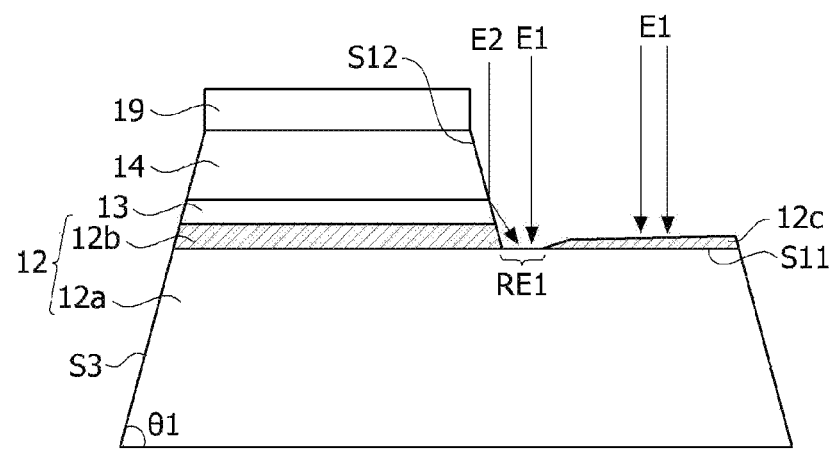
Figure 3C:
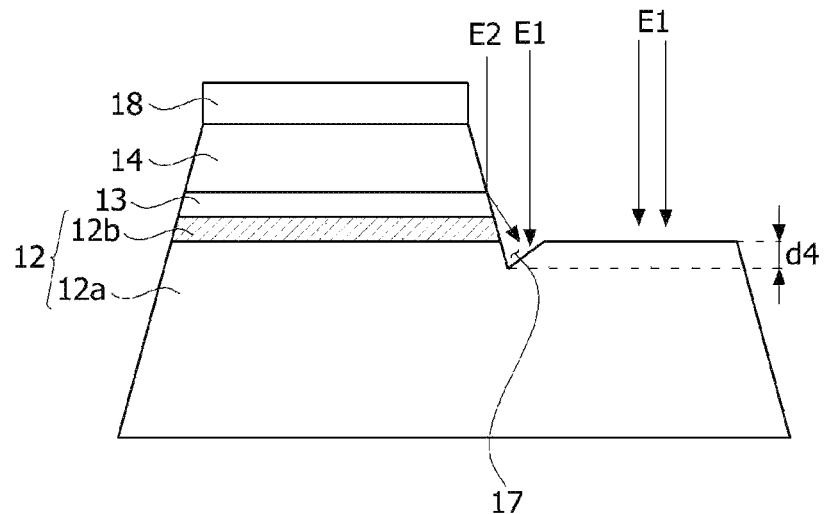
Figure 4:
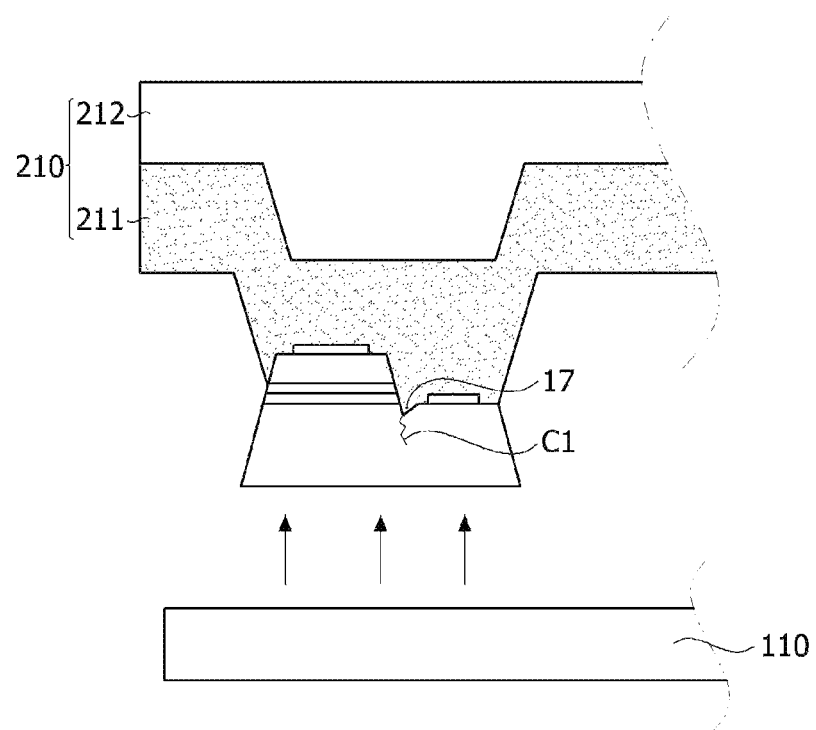
FIG. 4 is a diagram for describing a reason why a semiconductor device is broken due to the recess of FIG. 1.

FIG. 1 is a sectional view of a semiconductor device according to an embodiment of the present invention, FIG. 2 is a plan view of a semiconductor device according to an embodiment of the present invention, FIGS. 3A to 3C are diagrams for describing a reason why a recess of FIG. 1 is formed, and FIG. 4 is a diagram for describing a reason why a semiconductor device is broken by the recess of FIG. 1.

Referring to FIGS. 1 and 2, a semiconductor device according to an embodiment includes a semiconductor structure 140 including a first conductive semiconductor layer 12, a second conductive semiconductor layer 14, and an active layer 13 disposed between the first conductive semiconductor layer 12 and the second conductive semiconductor layer 14, a first electrode 15 electrically connected to the first semiconductor layer 12, and a second electrode 16 electrically connected to the second semiconductor layer 14.

The active layer 13 may generate light in one or more of the blue wavelength range, the green wavelength range, and the red wavelength range. That is, the semiconductor device may emit various colors of visible light.

An insulating layer 18 may be disposed on an upper surface S1 and side surfaces S2, S3, S4, and S5 of the semiconductor structure 140 and may include a first hole H1 through which the first electrode 15 is to be exposed and a second hole H2 through which the second electrode 16 is to be exposed. The insulating layer 18 may contain a material such as $SiO_2$, $SiN_x$, $TiO_2$, polyimide, and a resin.

The upper surface S1 of the semiconductor structure may include a first upper surface S11 through which the first semiconductor layer 12 is exposed, a second upper surface S13 on which the second semiconductor layer 14 is disposed, and an inclined surface S12 which connects the first upper surface S11 to the second upper surface S13.

The area of the first upper surface S11 may range from 30% to 110% of the area of the second upper surface S13. As an example, the area of the first upper surface S11 may range from 40% to 110% of the area of the second upper surface S13.

The semiconductor device according to an embodiment is a micro-semiconductor device having a small size, and thus a mesa-etched area may be relatively increased even if the minimum area of the first electrode 15 is secured. Accordingly, when the area of the first upper surface S11 is greater than or equal to 30%, the first electrode 15 may be widened to reduce ohmic resistance. Accordingly, it is possible to reduce operating voltage and improve optical output power.

The ratio of a first vertical height $d_1$ from a bottom surface B1 of the semiconductor structure 140 to the second upper surface S13 to a second vertical height $d_2$ from the bottom surface B1 of the semiconductor structure 140 to the first upper surface S11 ($d_1:d_2$) may range from 1:0.6 to 1:0.95. When the height ratio ($d_1:d_2$) is smaller than 1:0.6, the step height is increased, and thus the defective rate may be increased during a transfer process. When the height ratio is greater than 1:0.95, the mesa-etching depth is decreased, and thus the first conductive semiconductor layer 12 may not be partially exposed.

The first vertical height $d_1$ may range from 5 μm to 8 μm. That is, the first vertical height $d_1$ may be the entire thickness of the semiconductor structure 140. The second vertical height $d_2$ may range from 3.0 μm to 7.6 μm. In this case, a difference $d_3$ between the first vertical height $d_1$ and the second vertical height $d_2$ may range from 350 nm to 2.0 μm. When the height difference $d_3$ is greater than 2.0 μm, misalignment occurs while a semiconductor device is being transferred, and thus it is difficult to transfer the semiconductor device to a desired position. Also, when the height difference $d_3$ is smaller than 350 nm, the first conductive semiconductor layer 12 may not be partially exposed.

When the difference $d_3$ between the first vertical height $d_1$ and the second vertical height $d_2$ is less than or equal to 1.0 μm, the upper surface of the semiconductor structure may become almost flat, and thus it is possible to facilitate the transfer and also suppress occurrence of cracks. For example, the difference $d_3$ between the first vertical height $d_1$ and the second vertical height $d_2$ may be 0.6 μm±0.2 μm, but the present invention is not limited thereto.

A first angle $\theta_2$ between the inclined surface S12 and a virtual horizontal surface may range from 20° to 80° or from 20° to 50°. When the first angle $\theta_2$ is smaller than 20°, the area of the second upper surface S13 is decreased, and thus optical output power may be reduced. Also, when the first angle $\theta_2$ is greater than 80°, the inclination angle is increased, and thus a risk of breakage due to an external impact may be increased.

Also, a second angle $\theta_1$ between the horizontal surface and the side surfaces S2, S3, S4, and S5 of the semiconductor structure 140 may range from 70° to 90°. When the second angle $\theta_1$ is smaller than 70°, the area of the second upper surface S13 is decreased, and thus optical output power may be reduced. In this case, the first angle $\theta_2$ may be smaller than the second angle $\theta_1$. In this case, the inclined surface S12 has a gentle slope, and thus a risk of occurrence of a crack due to an external impact may be decreased.

In this case, when the side surfaces S2, S3, S4, and S5 of the semiconductor structure 140 are all inclined, the inclined surface S12 may have a width (a width in a y-direction) decreasing from the first upper surface S11 toward the second upper surface S13.

The first semiconductor layer 12 may include a plurality of sub-semiconductor layers 12a and 12b. The plurality of sub-semiconductor layers 12a and 12b may include various semiconductor layers for improving epitaxial crystallinity and/or light extraction efficiency. Alternatively, the plurality of sub-semiconductor layers 12a and 12b may include a semiconductor layer necessary for epitaxial growth. There is no limitation on the number of sub-semiconductor layers.

As an example, the first semiconductor layer 12 may include a first sub-semiconductor layer 12a on which the first electrode 15 is to be disposed and a second sub-semiconductor layer 12b which is disposed between the first sub-semiconductor layer 12a and the active layer 13.

The first sub-semiconductor layer 12a may be exposed by mesa-etching. A plurality of sub-semiconductor layers may be further disposed below the first sub-semiconductor layer 12a.

The semiconductor structure 140 may include a recess 17 formed between the first upper surface S11 and the inclined surface S12.

The recess 17 may be formed by a difference in etching rate among the semiconductor layers. The depth $d_4$ of the recess 17 may be less than or equal to 30% of a vertical distance (an etching depth $d_3$) between the first upper surface S11 and the second upper surface S13. When the depth $d_4$ of the recess 17 exceeds 30% of the vertical distance $d_3$, a crack may occur in the recess 17 during the transfer process. Accordingly, it is necessary to control the depth $d_4$ of the recess 17 to be 30% or less of the vertical distance $d_3$ between the first upper surface S11 and the second upper surface S13. Also, when the depth $d_4$ of the recess 17 is controlled to be 10% or less of the vertical distance $d_3$ between the first upper surface S11 and the second upper surface S13, the semiconductor device may become robust against an external impact.

The depth $d_4$ of the recess 17 may be adjusted by controlling the etching rates of the sub-semiconductor layers 12a and 12b. As an example, a difference in etching rate between the sub-semiconductor layers 12a and 12b may be controlled to be 30% or less. When the sub-semiconductor layers 12a and 12b have the same etching rate, the recess 17 may not be formed.

Referring to FIGS. 3A and 3B, in order to form the first electrode 15, the first sub-semiconductor layer 12a may be exposed by mesa-etching a portion of the semiconductor structure 140. The first sub-semiconductor layer 12a may be a layer having a relatively low resistance and having a low contact resistance with the first electrode 15.

The second sub-semiconductor layer 12b may be a layer disposed between the active layer 13 and the first sub-semiconductor layer 12a. As an example, the first sub-semiconductor layer 12a may be a contact layer that is in contact with an N-type ohmic electrode, and the second sub-semiconductor layer 12b may be an N-type semiconductor layer. However, the present invention is not limited thereto.

The first sub-semiconductor layer 12a and the second sub-semiconductor layer 12b may contain the same dopants. As an example, the first sub-semiconductor layer 12a and the second sub-semiconductor layer 12b may contain N-type dopants. However, the present invention is not limited thereto. As an example, the first sub-semiconductor layer 12a may include no dopants.

The first sub-semiconductor layer 12a and the second sub-semiconductor layer 12b may have different compositions and different composition ratios. As an example, when the semiconductor device is a red light emitting device, the first sub-semiconductor layer 12a may be a layer containing GaAs, and the second sub-semiconductor layer 12b may be a layer containing AlInP. However, the present invention is not limited thereto.

Referring to FIG. 3B, a mask 19 may be formed in an unetched region, and plasma E1 may be emitted. In this case, etching plasma E1 is emitted to the first upper surface S11 of the semiconductor structure 140 almost vertically, but etching plasma E1 and E2 may be scattered in a boundary region RE1 between the first upper surface S11 and the inclined surface S12. That is, since both the plasma E1 that is vertically emitted and the plasma E2 that is refracted by the inclined surface S12 are emitted to the boundary region RE1, the plasma may be concentrated in the boundary region RE1.

Accordingly, the first sub-semiconductor layer 12a may have been already removed in the region RE1 close to the inclined surface S12 before the first sub-semiconductor layer 12a is completely removed. On the contrary, a first sub-semiconductor layer 12c may still remain on a portion of the first upper surface S11.

Referring to FIG. 3C, when etching plasma is emitted to remove the remaining first sub-semiconductor layer 12c, a portion of the second sub-semiconductor layer 12b exposed to the boundary region RE1 may be etched out, and thus the recess 17 may be formed. In this case, when the etching rate of the second sub-semiconductor layer 12b is higher than the etching rate of the first sub-semiconductor layer 12a, the depth $d_4$ of the recess 17 may be increased.

In the boundary region RE1 between the first upper surface S11 and the inclined surface S12, the plasma is concentrated, and the etching rate of the second sub-semiconductor layer 12b is so fast that the recess 17 may be formed to be very deep before the remaining first sub-semiconductor layer 12c is completely removed.

Referring to FIG. 4, the micro-semiconductor device may be selectively conveyed to another substrate through the transfer process. For example, in order to form pixels of a display, the micro-semiconductor device may be separated from a growth substrate and then transferred to a substrate of the display by a conveying apparatus 210.

In this process, a physical impact may be applied to the micro-semiconductor device, and the applied external stress may cause a crack C1 to be generated in the recess 17. Accordingly, a problem occurs in which some of the pixels of the display may malfunction.

Accordingly, it may be important to control the depth of the recess 17 in the micro-semiconductor device. In the case of a general visible light semiconductor device, a chip has a relatively large size, and thus such a recess may be ignored.

Referring to FIGS. 1 and 2 again, the difference in etching rate between the first sub-semiconductor layer 12a and the second sub-semiconductor layer 12b may be 30% or less when the etching is performed under the same conditions. The same conditions may be defined as a state in which various control factors, such as an etching source, a temperature, and a voltage, for controlling the etching rate are kept the same as before.

When the etching rate difference is 30% or less, the depth of the recess 17 formed on the second sub-semiconductor layer 12b while the portion of the first sub-semiconductor layer 12a remaining on the first upper surface S11 is being removed may be controlled to less than 30% of the vertical height $d_3$ between the first upper surface S11 and the second upper surface S13.

The etching rate of the semiconductor layer may be controlled by changing the composition of the semiconductor layer. As an example, InP may have a lower etching rate than GaAs. Also, in the case of a specific factor such as indium (In), the etching rate may relatively decrease as the amount of the factor increases. As an example, in the case of the same InP composition, the etching rate may relatively decrease as the composition of indium increases.

When the first sub-semiconductor layer 12a contains GaAs and the second sub-semiconductor layer 12b contains AlInP, the etching rate of GaAs is relatively high, and thus the recess 17 may be formed to be deep. In this case, the depth of the recess 17 may be decreased by adding indium to the first sub-semiconductor layer 12a or forming the first sub-semiconductor layer 12a of AlInP.

When the first sub-semiconductor layer 12a and the second sub-semiconductor layer 12b have the same composition, the depth of the recess 17 may be relatively decreased. As an example, when the first sub-semiconductor layer 12a and the second sub-semiconductor layer 12b are all formed of AlInP, the etching rates may be controlled to be equal to each other. However, even in this case, when plasma is concentrated on the inclined surface S12, the recess 17 may be formed near the inclined surface.

In this case, when the composition of indium contained in the first sub-semiconductor layer 12a is controlled to be higher than the indium composition of the second sub-semiconductor layer 12b, the etching rate of the first sub-semiconductor layer 12a is relatively decreased, and thus it is possible to control the depth of the recess 17 to be smaller. Accordingly, it is possible to control the depth of the recess 17 by controlling the composition of an etching rate control factor (e.g., indium) while maintaining optical and/or electrical performance.

That is, when the etching rate of the first sub-semiconductor layer 12a is lower than the etching rate of the second sub-semiconductor layer 12b, the size of the recess 17 may be controlled to be smaller. Also, when the first electrode 15 is disposed on a sub-semiconductor layer nearest to the bottom of the active layer 13, it is possible to control a difference in etching rate between the sub-semiconductor layer and the active layer 13.

Figure 5:
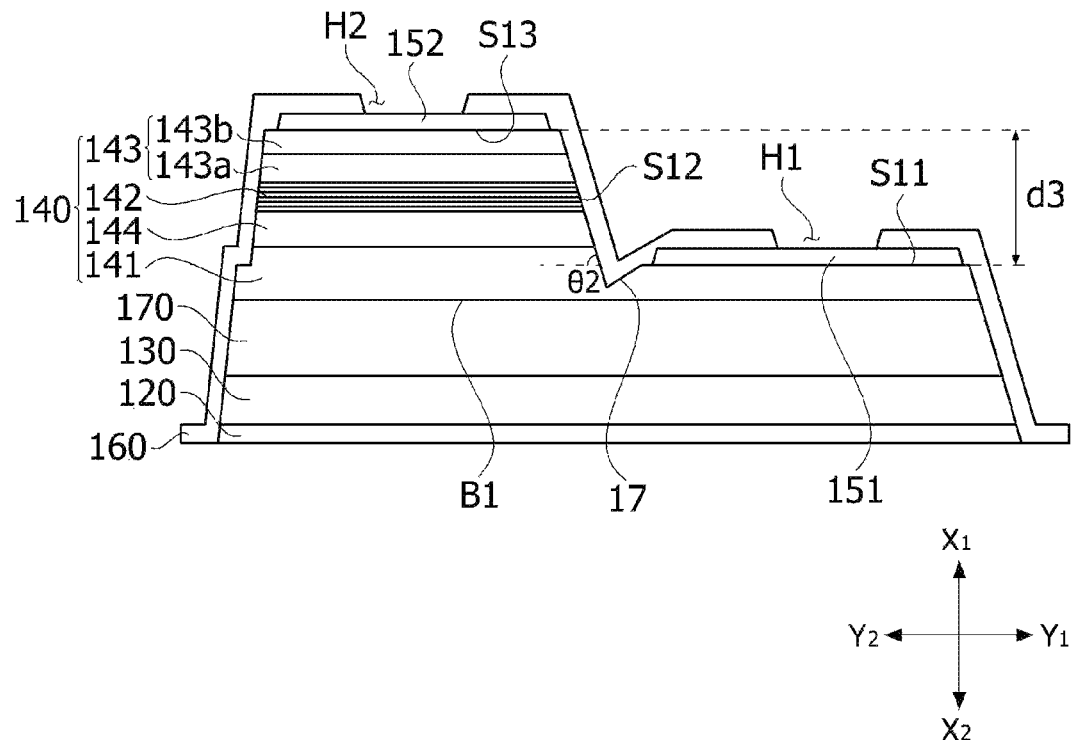
FIG. 5 is a sectional view of a semiconductor device according to another embodiment of the present invention.

FIG. 5 is a sectional view of a semiconductor device according to another embodiment of the present invention.

The semiconductor device according to this embodiment may include a sacrificial layer 120, a coupling layer 130 disposed on the sacrificial layer 120, an intermediate layer 170 disposed on the coupling layer 130, a first conductive semiconductor layer 141 disposed on the intermediate layer 170, a first clad layer 144 disposed on the first conductive semiconductor layer 141, an active layer 142 disposed on the first clad layer 144, a second conductive semiconductor layer 143 disposed on the active layer 142, a first electrode 151 electrically connected to the first conductive semiconductor layer 141, a second electrode 152 electrically connected to the second conductive semiconductor layer 143, and an insulating layer 160 surrounding the sacrificial layer 120, the coupling layer 130, the first conductive semiconductor layer 141, the first clad layer 144, the active layer 142, and the second conductive semiconductor layer 143.

The sacrificial layer 120 may be a layer that is disposed on the bottom of the semiconductor device according to this embodiment. That is, the sacrificial layer 120 may be an outermost layer in a first-second direction (an $X_2$-axis direction). The sacrificial layer 120 may be disposed on a substrate (not shown).

The sacrificial layer 120 may have a maximum width $W_1$ ranging from 30 μm to 60 μm in a second direction (a Y-axis direction).

Here, the first direction is a thickness direction of a semiconductor structure 140 and includes a first-first direction and a first-second direction. The first-first direction of the thickness direction of the semiconductor structure 140 is a direction from the first conductive semiconductor layer 12 to the second conductive semiconductor layer 143. Also, the first-second direction of the thickness direction of the semiconductor structure 140 is a direction from the second conductive semiconductor layer 143 to the first conductive semiconductor layer 12. Also, here, the second direction (the Y-axis direction) may be perpendicular to the first direction (the X-axis direction). Also, the second direction (the Y-axis direction) includes a second-first direction (an $Y_1$-axis direction) and a second-second direction (an $Y_2$-axis direction).

The sacrificial layer 120 may be a layer that remains after the semiconductor device is transferred to a display apparatus. For example, when the semiconductor device is transferred to the display apparatus, a portion of the sacrificial layer 120 may be separated from the semiconductor device by laser light emitted during the transfer, and a portion which is not separated may remain. In this case, the sacrificial layer 120 may contain a material that is separable at the wavelength of the emitted laser light. Also, the wavelength of the laser light may be any one of 266 nm, 532 nm, and 1064 nm, but the present invention is not limited thereto.

The sacrificial layer 120 may contain an oxide or a nitride. However, the present invention is not limited thereto. For example, the sacrificial layer 120 may contain an oxide-based material, which is a material that is less deformed during epitaxial growth.

The sacrificial layer 120 may contain at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf.

The sacrificial layer 120 may have a thickness $d_1$ greater than or equal to 20 nm in the first direction (the X-axis direction). Preferably, the thickness $d_1$ of the sacrificial layer 120 in the first direction (the X-axis direction) may be greater than or equal to 40 nm.

The sacrificial layer 120 may be formed by e-beam evaporation, thermal evaporation, metal-organic chemical vapor deposition (MOCVD), or sputtering and pulsed laser deposition (PLD), but the present invention is not limited thereto.

The coupling layer 130 may be disposed on the sacrificial layer 120. The coupling layer 130 may contain a material such as $SiO_2$, $SiN_x$, $TiO_2$, polyimide, and a resin.

The coupling layer 130 may have a thickness $d_2$ of 30 nm to 1 μm. However, the present invention is not limited thereto. Here, the thickness may be a length in the X-axis direction. The coupling layer 130 may be annealed to bond the sacrificial layer 120 to the intermediate layer 170. In this case, hydrogen ions are discharged from the coupling layer 130, and thus delamination may occur. In this case, the coupling layer 130 may have a surface roughness of 1 nm or less. According to such a configuration, it is possible to facilitate bonding between a separation layer and a coupling layer. The positions of the coupling layer 130 and the sacrificial layer 120 may be switched with each other.

The intermediate layer 170 may be disposed on the coupling layer 130. The intermediate layer 170 may contain GaAs. The intermediate layer 170 may be coupled to the sacrificial layer 120 through the coupling layer 130.

The semiconductor structure 140 may be disposed on the intermediate layer 170. The semiconductor structure 140 may include the first conductive semiconductor layer 141 disposed on the intermediate layer 170, the first clad layer 144 disposed on the first conductive semiconductor layer 141, the active layer 142 disposed on the first clad layer 144, and the second conductive semiconductor layer 143 disposed on the active layer 142.

The first conductive semiconductor layer 141 may be disposed on the intermediate layer 170. The first conductive semiconductor layer 141 may have a thickness of 1.8 μm to 2.2 μm. However, the present invention is not limited thereto.

The first conductive semiconductor layer 141 may be made of a group III-V or group II-VI compound semiconductor and may be doped with first dopants. The first conductive semiconductor layer 141 may contain a semiconductor material having an empirical formula $In_xAl_yGa_{1-x-y}P$ ($0 \leq x \leq 1$, $0 \leq y \leq 1$, and $0 \leq x+y \leq 1$) or $In_xAl_yGa_{1-x-y}N$ ($0 \leq x \leq 1$, $0 \leq y \leq 1$, and $0 \leq x+y \leq 1$).

Also, the first dopants may be n-type dopants such as Si, Ge, Sn, Se, and Te. When the first dopants are n-type dopants, the first conductive semiconductor layer 141 doped with the first dopants may be an n-type semiconductor layer.

The first conductive semiconductor layer 141 may contain any one or more of AlGaP, InGaP, AlInGaP, InP, GaN, InN, AlN, InGaN, AlGaN, InAlGaN, AlInN, AlGaAs, InGaAs, AlInGaAs, and GaP.

The first conductive semiconductor layer 141 may be formed by chemical vapor deposition (CVD), molecular beam epitaxy (MBE), sputtering or hydride vapor phase epitaxy (HVPE), or the like, but the present invention is not limited thereto.

The first clad layer 144 may be disposed on the first conductive semiconductor layer 141. The first clad layer 144 may be disposed between the first conductive semiconductor layer 141 and the active layer 142. The first clad layer 144 may include a plurality of layers. The first clad layer 144 may include an AlInP-based layer/AlInGaP-based layer.

The first clad layer 144 has a thickness $d_5$ of 0.45 μm to 0.55 μm. However, the present invention is not limited thereto.

According to an embodiment, the first conductive semiconductor layer 141 and the first clad layer 144 may have the same etching rate when produced as an AlInP-based layer, and thus it is possible to suppress the recess 17 from being formed between the first upper surface S11 and the boundary surface S12. In this case, when the amount of indium contained in the first conductive semiconductor layer 141 is controlled to be higher than the amount of indium contained in the first clad layer 144, the depth of the recess 17 may be controlled to be smaller.

The active layer 142 may be disposed on the first clad layer 144. The active layer 142 may be disposed between the first conductive semiconductor layer 141 and the second conductive semiconductor layer 143. The active layer 142 is a layer in which electrons (or holes) injected through the first conductive semiconductor layer 141 are combined with holes (or electrons) injected through the second conductive semiconductor layer 143. Electrons and holes may transition to a lower energy level due to electron-hole recombination and thus the active layer 142 may generate ultraviolet wavelength light.

The active layer 142 may have, but is not limited to, any one of a single-well structure, a multi-well structure, a single-quantum-well structure, a multi-quantum-well (MQW) structure, a quantum dot structure, or a quantum wire structure.

The active layer 142 may be formed as a paired structure of one or more of GaInP/AlGaInP, GaP/AlGaP, InGaP/AlGaP, InGaN/GaN, InGaN/InGaN, GaN/AlGaN, InAlGaN/GaN, GaAs/AlGaAs, and InGaAs/AlGaAs, but the present invention is not limited thereto.

The active layer 142 may have a thickness $d_6$ of 0.54 μm to 0.66 μm. However, the present invention is not limited thereto.

Since electrons are cooled in the first clad layer 144, the active layer 142 may generate more radiation recombination.

The second conductive semiconductor layer 143 may be disposed on the active layer 142. The second conductive semiconductor layer 143 may include a second-first conductive semiconductor layer 143a and a second-second conductive semiconductor layer 143b.

The second-first conductive semiconductor layer 143a may be disposed on the active layer 142. The second-second conductive semiconductor layer 143b may be disposed on the second-first conductive semiconductor layer 143a.

The second-first conductive semiconductor layer 143a may contain TSBR and P—AlInP. The second-first conductive semiconductor layer 143a may have a thickness $d_7$ of 0.57 µm to 0.70 µm. However, the present invention is not limited thereto.

The second-first conductive semiconductor layer 143a may be made of a group III-V or group II-VI compound semiconductor. The second-first conductive semiconductor layer 143a may be doped with second dopants.

The second-first conductive semiconductor layer 143a may contain a semiconductor material having an empirical formula $In_xAl_yGa_{1-x-y}P$ (0≤x≤1, 0≤y≤1, and 0≤x+y≤1) or $In_xAl_yGa_{1-x-y}N$ (0≤x≤1, 0≤y≤1, and 0≤x+y≤1). When the second conductive semiconductor layer 143 is a p-type semiconductor layer, the second conductive semiconductor layer 143 may contain Mg, Zn, Ca, Sr, Ba or the like as p-type dopants.

The second-first conductive semiconductor layer 143a doped with second dopants may be a p-type semiconductor layer.

The second-second conductive semiconductor layer 143b may be disposed on the second-first conductive semiconductor layer 143a. The second-second conductive semiconductor layer 143b may include a p-type GaP-based layer.

The second-second conductive semiconductor layer 143b may include a superlattice structure of a GaP layer/$In_xGa1-xP$ layer (0≤x≤1).

For example, the second-second conductive semiconductor layer 143b may be doped with Mg at a concentration of about $10 \times 10^{-18}$, but the present invention is not limited thereto.

Also, the second-second conductive semiconductor layer 143b may include a plurality of layers, only some of which may be doped with Mg.

The second-second conductive semiconductor layer 143b may have a thickness $d_8$ of 0.9 µm to 1.1 µm. However, the present invention is not limited thereto.

The first electrode 151 may be disposed on the first conductive semiconductor layer 141. The first electrode 151 may be electrically connected to the first conductive semiconductor layer 141.

The first electrode 151 may be disposed on a portion of an upper surface of the first conductive semiconductor layer 141 in which mesa-etching is performed. Thus, the first electrode 151 may be disposed below the second electrode 152 disposed on top of the second conductive semiconductor layer 143.

A minimum width $W_2$ in the second-second direction (the $Y_2$-axis direction) between the second electrode 152 and an edge of the insulating layer 160 in the second-second direction (the $Y_2$-axis direction) may range from 2.5 µm to 3.5 µm. Likewise, a minimum width $W_6$ in the second-first direction (the $Y_1$-axis direction) between the first electrode 151 and an edge of the insulating layer 160 in the second-first direction (the $Y_1$-axis direction) may range from 2.5 µm to 3.5 µm. However, the present invention is not limited thereto.

The first electrode 151 may contain, but is not limited to, at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf.

Any electrode formation methods that are typically used, such as sputtering, coating, and deposition, may be applied to the first electrode 151.

As described above, the second electrode 152 may be disposed on the second-second conductive semiconductor layer 143b. The second electrode 152 may be electrically connected to the second-second conductive semiconductor layer 143b.

The second electrode 152 may contain, but is not limited to, at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf.

Any electrode formation methods that are typically used, such as sputtering, coating, and deposition, may be applied to the second electrode 152.

Also, the first electrode 151 may have a greater width in the second direction (the Y-axis direction) than the second electrode 152. However, the present invention is not limited thereto.

The insulating layer 160 may cover the sacrificial layer 120, the coupling layer 130, and the semiconductor structure 140. The insulating layer 160 may cover side surfaces of the sacrificial layer 120 and the coupling layer 130. The insulating layer 160 may cover a portion of an upper surface of the first electrode 151. According to such a configuration, the first electrode 151 is electrically connected to an electrode or pad through an exposed portion of the upper surface so that electric current may be injected into the first electrode 151. Like the first electrode 151, the second electrode 152 may include an exposed upper surface. The insulating layer 160 covers the sacrificial layer 120 and the coupling layer 130 so that the sacrificial layer 120 and the coupling layer 130 may not be exposed to the outside.

The insulating layer 160 may cover a portion of the upper surface of the first electrode 151. Also, the insulating layer 160 may cover a portion of an upper surface of the second electrode 152. A portion of the upper surface of the first electrode 151 may be exposed. A portion of the upper surface of the second electrode 152 may be exposed.

The exposed portion of the upper surface of the first electrode 151 and the exposed portion of the upper surface of the second electrode 152 may have circular shapes, but the present invention is not limited thereto. Also, a distance $W_4$ in the second direction (the Y-axis direction) between a center point of the exposed portion of the upper surface of the first electrode 151 and a center point of the exposed portion of the upper surface of the second electrode 152 may range from 20 µm to 30 µm. Here, the center points refer to points that bisect the widths of the portions of the first electrode and the second electrode exposed in the second direction (the Y-axis direction).

In the semiconductor structure 140, the insulating layer 160 may electrically separate the first conductive semiconductor layer 141 from the second conductive semiconductor layer 143. The insulating layer 160 may be formed of at least one material selected from a group consisting of $SiO_2$, $Si_xO_y$, $Si_3N_4$, $Si_xN_y$, $SiO_xN_y$, $Al_2O_3$, $TiO_2$, and AlN, but the present invention is not limited thereto.

FIGS. 6A to 6G are diagrams illustrating a method of manufacturing a semiconductor device array according to an embodiment of the present invention.

Figure 6A:
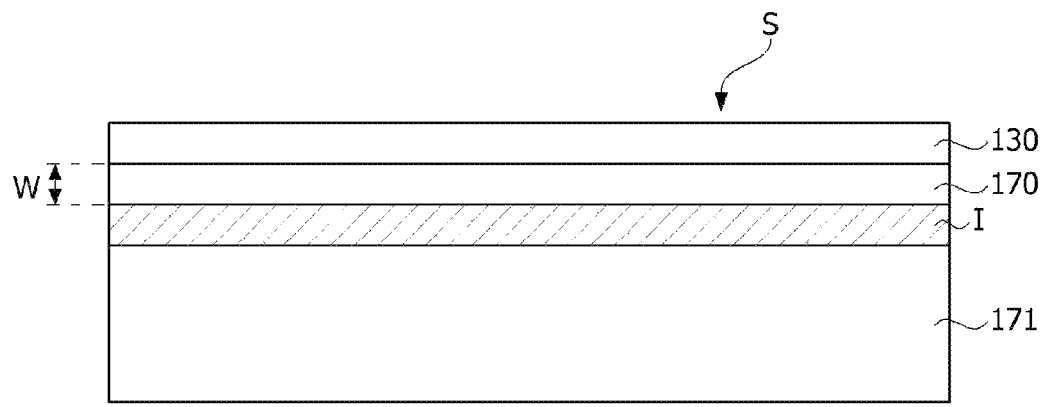
FIGS. 6A to 6G are diagrams illustrating a method of manufacturing a semiconductor device array according to an embodiment of the present invention.

Referring to FIG. 6A, first, a step of forming a first substrate may include implanting ions into a donor substrate S. The donor substrate S may include an ionic layer I. Due to the ionic layer I, the donor substrate S may include an intermediate layer 170 disposed at one side and a first layer 171 disposed at the other side. The ions implanted into the donor substrate S may include hydrogen (H) ions, but the present invention is not limited thereto.

Figure 6B:
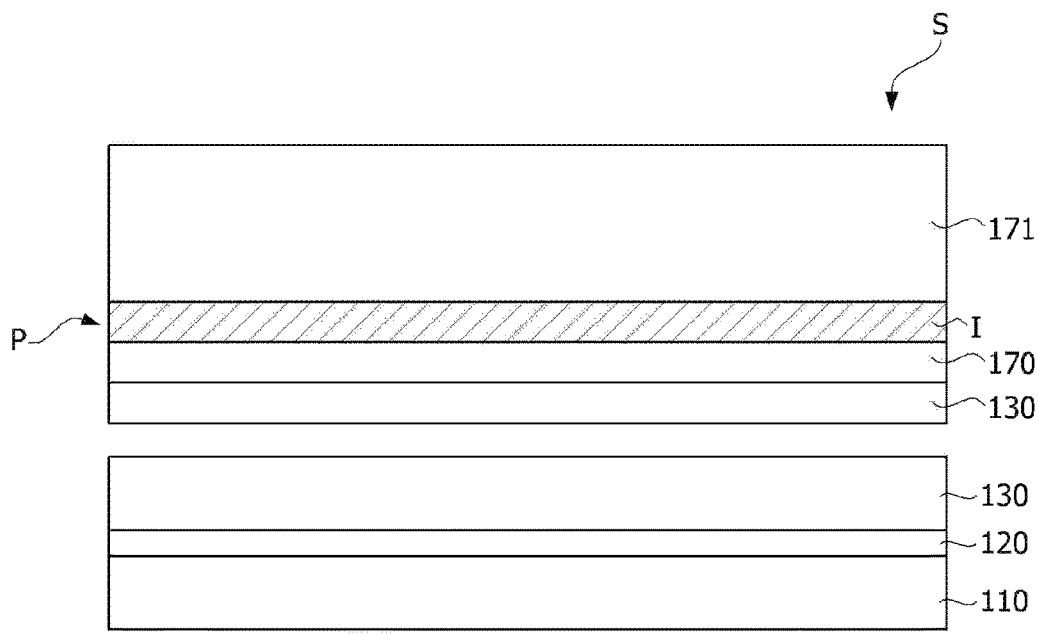

Referring to FIG. 6B, the sacrificial layer 120 may be disposed between the substrate 110 and the coupling layer 130.

The substrate 110 may be a transparent substrate containing sapphire ($Al_2O_3$), glass, etc. Thus, the substrate 110 may transmit laser light emitted from the bottom thereof. Accordingly, during laser lift-off, the sacrificial layer 120 may absorb laser light.

The sacrificial layer 120 and the coupling layer 130 may be stacked on the substrate 110. The sacrificial layer 120 and the coupling layer 130 may be stacked in reverse order.

The coupling layer 130 disposed on the substrate may be disposed to face the coupling layer 130 disposed on the donor substrate S. The coupling layer 130 disposed on the substrate and the coupling layer 130 disposed on the donor substrate S may contain $SiO_2$, but the present invention is not limited thereto.

The coupling layer 130 disposed on the sacrificial layer 120 may be coupled to the coupling layer 130 disposed on the donor substrate S through $O_2$ plasma treatment. However, the present invention is not limited thereto, and cutting may be accomplished by a material other than oxygen.

Thus, the sacrificial layer 120 may be disposed on the substrate 110, the coupling layer 130 may be disposed on the sacrificial layer 120, and the donor substrate S may be separated from and disposed above the coupling layer 130.

Figure 6C:
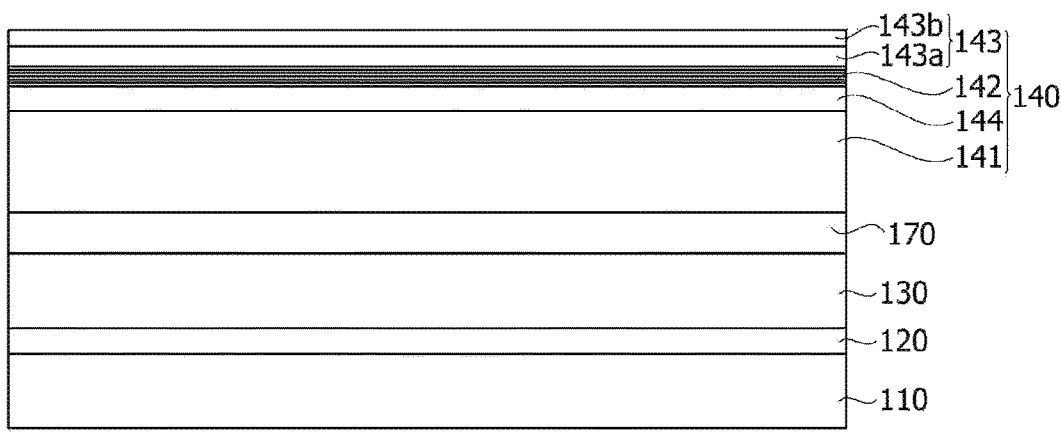

Referring to FIG. 6C, the ionic layer I of FIG. 6B is removed by fluid jet cleaving so that the first layer 171 may be separated from the intermediate layer 170.

In this case, the first layer 171 separated from the donor substrate may be reused as a substrate. Accordingly, it is possible to reduce manufacturing cost and raw material cost.

A step of forming a semiconductor structure layer on a first substrate may include forming the semiconductor structure 140 on the intermediate layer 170. The intermediate layer 170 may be in contact with the semiconductor structure 140. However, since the intermediate layer 170 has an upper surface of which roughness is not high due to voids generated by an ion implantation process, defects may occur during Red Epi deposition.

Accordingly, a planarization process may be performed on an upper surface of the intermediate layer 170. For example, chemical mechanical planarization may be performed on the upper surface of the intermediate layer 170, and the semiconductor structure 140 may be disposed on the upper surface of the intermediate layer 170 after the planarization. According to such a configuration, it is possible to improve electrical characteristics of the semiconductor structure 140.

The semiconductor structure 140 may include the first conductive semiconductor layer 141 disposed on the intermediate layer 170, the first clad layer 144 disposed on the first conductive semiconductor layer 141, the active layer 142 disposed on the first clad layer 144, and the second conductive semiconductor layer 143 disposed on the active layer 142. A detailed configuration of the semiconductor structure 140 will be described below.

Figure 6D:
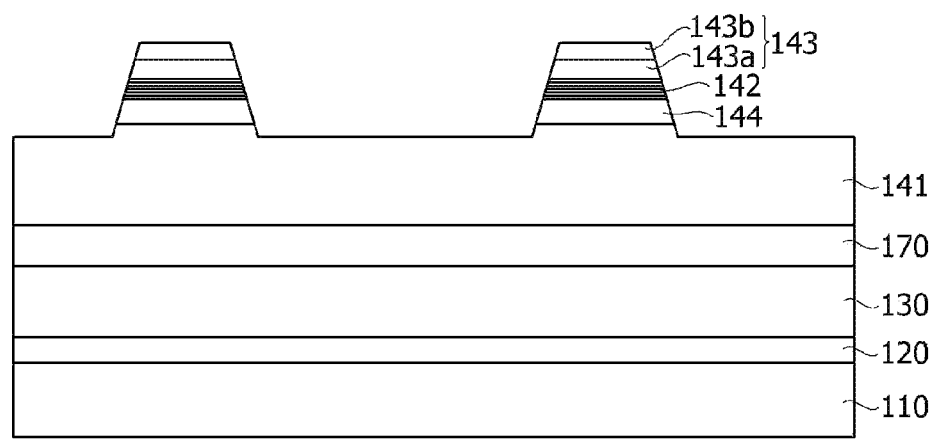

Referring to FIG. 6D, first etching may be performed to expose the first conductive semiconductor layer 141 from the top of the semiconductor structure 140. The above-described recess 17 may be formed through this process.

Figure 6E:
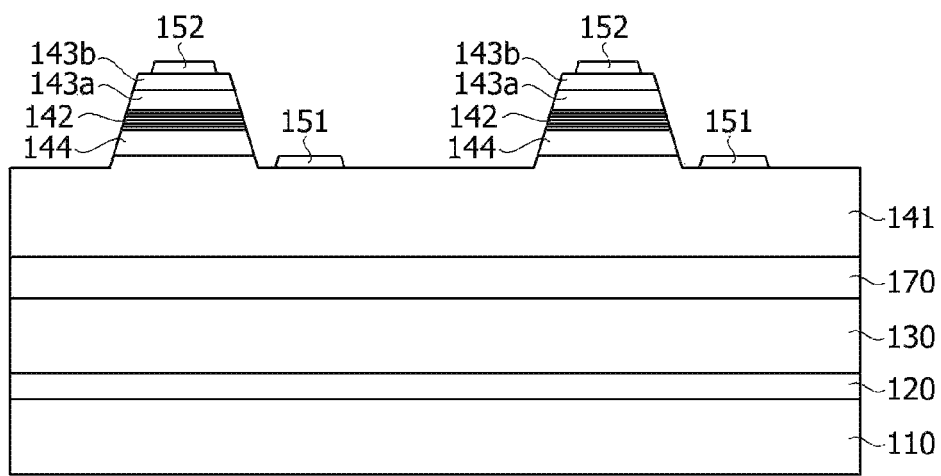

The first etching may be wet-etching or dry-etching. However, the present invention is not limited thereto, and various methods may be applied for the first etching. Before the first etching is performed, the second electrode 152 of FIG. 6E may be disposed on the second conductive semiconductor layer 143 and then patterned as shown in FIG. 6E. However, the present invention is not limited thereto.

Referring to FIG. 6E, a step of forming an electrode on the semiconductor structure may include forming the first electrode 151 and the second electrode 152 on top of the semiconductor structure 140.

The second electrode 152 may be electrically connected to the second-second conductive semiconductor layer 143b. A lower surface of the second electrode 152 may have a smaller area than an upper surface of the second conductive semiconductor layer 143. For example, the second electrode 152 may be spaced 1 μm to 3 μm from an edge of the second-second conductive semiconductor layer 143b.

The first electrode 151 and the second electrode 152 may be formed by any electrode formation methods that are typically used, such as sputtering, coating, and deposition. However, the present invention is not limited thereto.

Also, as described above, the second electrode 152 may be formed before the first etching, and the first electrode 151 may be disposed on top of the first conductive semiconductor layer 141 etched and exposed after the first etching.

The first electrode 151 and the second electrode 152 may be disposed at positions spaced different distances from the substrate 110. The first electrode 151 may be disposed on the first conductive semiconductor layer 141. The second electrode 152 may be disposed on the second conductive semiconductor layer 143. Thus, the second electrode 152 may be disposed above the first electrode 151.

Figure 6F:
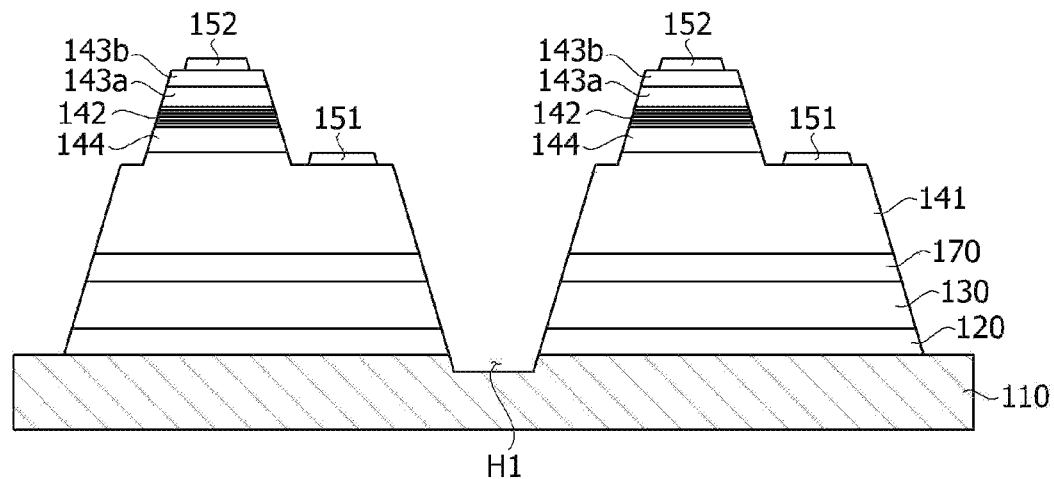

Referring to FIG. 6F, a step of cutting a plurality of semiconductor structures may include performing second etching up to an upper surface of the substrate 110. The second etching may be wet-etching or dry-etching, but the present invention is not limited thereto. In the semiconductor device, the second etching may be performed to have a greater thickness than the first etching.

Through the second etching, the semiconductor structure disposed on the substrate may be isolated in the form of a plurality of chips. For example, referring to FIG. 6F, two semiconductor structures may be disposed on the substrate 110 through the second etching. The number of semiconductor structures may be variously set depending on the size of the substrate and the size of each semiconductor structure. In this case, the step of separating the semiconductor structure and the step of forming the electrode may be performed in reverse order. That is, the semiconductor structure may be separated after the electrode is formed, and the electrode may be formed after the semiconductor structure is separated. Also, the first etching may be performed on the semiconductor structure to form an electrode, and then the semiconductor structure may be separated.

In this case, the second etching may be performed up to a portion of the substrate 110 through the semiconductor structure. Accordingly, the substrate 110 may have a recess H1 formed between the plurality of semiconductor structures. Since the recess H1 of the substrate is formed while the semiconductor structure 140 is etched, a side wall of the recess H1 may have the same inclination angle as side surfaces of the plurality of semiconductor structures 140. However, the present invention is not limited thereto, and the recess H1 of the substrate may be formed by a separate etching process.

According to such a configuration, it is possible to reliably remove the coupling layer 130 and/or the sacrificial layer disposed between the plurality of semiconductor structures. The depth of the recess H1 is not particularly limited as long as it can remove the coupling layer 130 and/or the sacrificial layer disposed between the semiconductor structures.

It is assumed that the coupling layer and/or the sacrificial layer of the semiconductor structures are connected to each other. When any semiconductor structure is separated from the substrate, the separation may affect neighboring semiconductor structures.

As an example, when only one semiconductor structure is separated from the substrate, the sacrificial layer of the neighboring semiconductor structure may also be separated from the substrate.

Figure 6G:
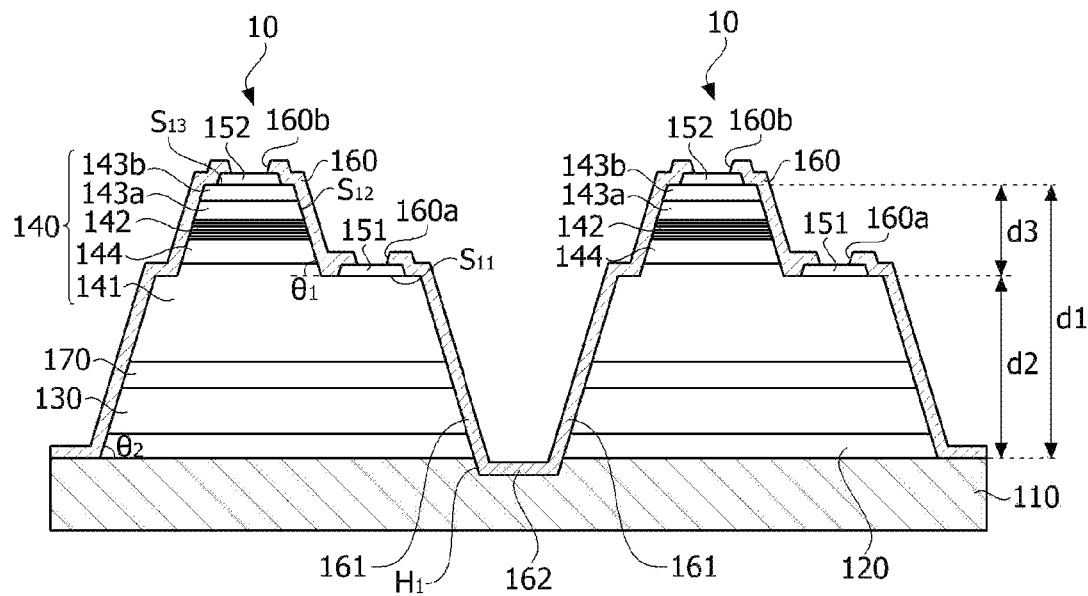

Referring to FIG. 6G, a step of forming an insulating layer may include forming the insulating layer 160 on the plurality of semiconductor structures 140 and the recess H1 as a whole. The insulating layer 160 may cover side surfaces of the sacrificial layer, the coupling layer 130, the intermediate layer 170, and the semiconductor structure 140.

The insulating layer 160 may cover even a portion of the upper surface of the first electrode 151. Also, a portion of the upper surface of the first electrode 151 may be exposed. Also, the exposed portion of the upper surface of the first electrode 151 is electrically connected to an electrode pad or the like so that electric current may be injected into the first electrode 151.

Also, the insulating layer 160 may cover even a portion of the upper surface of the second electrode 152. A portion of the upper surface of the second electrode 152 may be exposed. Like the first electrode 151, the exposed portion of the upper surface of the second electrode 152 is electrically connected to an electrode pad or the like so that electric current may be injected into the second electrode 152. Also, a portion of the insulating layer 160 may be disposed on top of the substrate. The insulating layer 160 disposed between adjacent semiconductor chips may be in contact with the substrate 110.

Referring to FIG. 6G, the manufactured semiconductor device array may include a substrate 110 and a plurality of semiconductor devices 10 disposed on the substrate 110. According to an embodiment, the plurality of semiconductor devices 10 may be disposed on the substrate 110.

Each of the plurality of semiconductor devices 10 may include a semiconductor structure 140 including a first conductive semiconductor layer 141, a second conductive semiconductor layer 143, and an active layer 142 disposed between the first conductive semiconductor layer 141 and the second conductive semiconductor layer 143, an insulating layer 160 disposed on the semiconductor structure 140, a first electrode 151 electrically connected to the first conductive semiconductor layer 141 through the insulating layer 160, and a second electrode 152 electrically connected to the second conductive semiconductor layer 143 through the insulating layer 160.

As described above, the substrate 110 may include a recess H1 formed between the plurality of semiconductor structures 140. The recess H1 may have a line shape, but the present invention is not limited thereto.

The insulating layer 160 may include a first insulating layer 161 disposed on an upper surface and a side surface of the semiconductor structure 140 and a second insulating layer 162 disposed in the recess H1 of the substrate 110. In this case, the first insulating layer 161 and the second insulating layer 162 may be connected to each other.

The insulating layer 160 may entirely cover the plurality of semiconductor structures 140, one surface of the substrate 110, and the recess H1 of the substrate 110.

An upper surface of each of the semiconductor structures 140 may include a first upper surface S11 on which the first electrode 151 is to be disposed, a second upper surface S13 on which the second electrode 152 is to be disposed, and an inclined surface S12 which is disposed between the first upper surface S1 and the second upper surface S2.

A difference d3 between a height $d_1$ from the bottom surface of the semiconductor structure 140 to the second upper surface S13 and a height $d_2$ from the bottom surface of the semiconductor structure 140 to the first upper surface S11 may be greater than zero and smaller than 2 μm.

When a height difference d3 between the first upper surface S11 and the second upper surface S13 is greater than 2 μm, the leveled chip may be misaligned during a transfer process. That is, as a step height increases, it may become difficult for the chip to remain level. A transfer process may refer to a task of moving a chip from a growth substrate to another substrate.

The first angle $\theta_1$ between the inclined surface S12 and the horizontal surface may be smaller than the second angle $\theta_2$ between a side surface of the semiconductor structure 140 and the horizontal surface. The first angle $\theta_1$ between the inclined surface S12 and a virtual horizontal surface may range from 20° to 50°. When the first angle $\theta_1$ is smaller than 20°, the area of the second upper surface S13 is decreased, and thus optical output power may be reduced. Also, when the first angle $\theta_1$ is greater than 50°, the inclination angle is increased, and thus a risk of breakage due to an external impact may be increased.

Also, the second angle $\theta_2$ between the horizontal surface and the side surface of the semiconductor structure 140 may be greater than 70° and smaller than 90°. When the second angle $\theta_2$ is smaller than 70°, the area of the second upper surface S13 is decreased, and thus optical output power may be reduced. In this case, when the second angle $\theta_2$ between the horizontal surface and all the side surfaces of the semiconductor structure 140 is smaller than 90°, the area of the inclined surface S12 may have an area decreasing from the first upper surface S11 to the second upper surface S13.

Figure 6H:
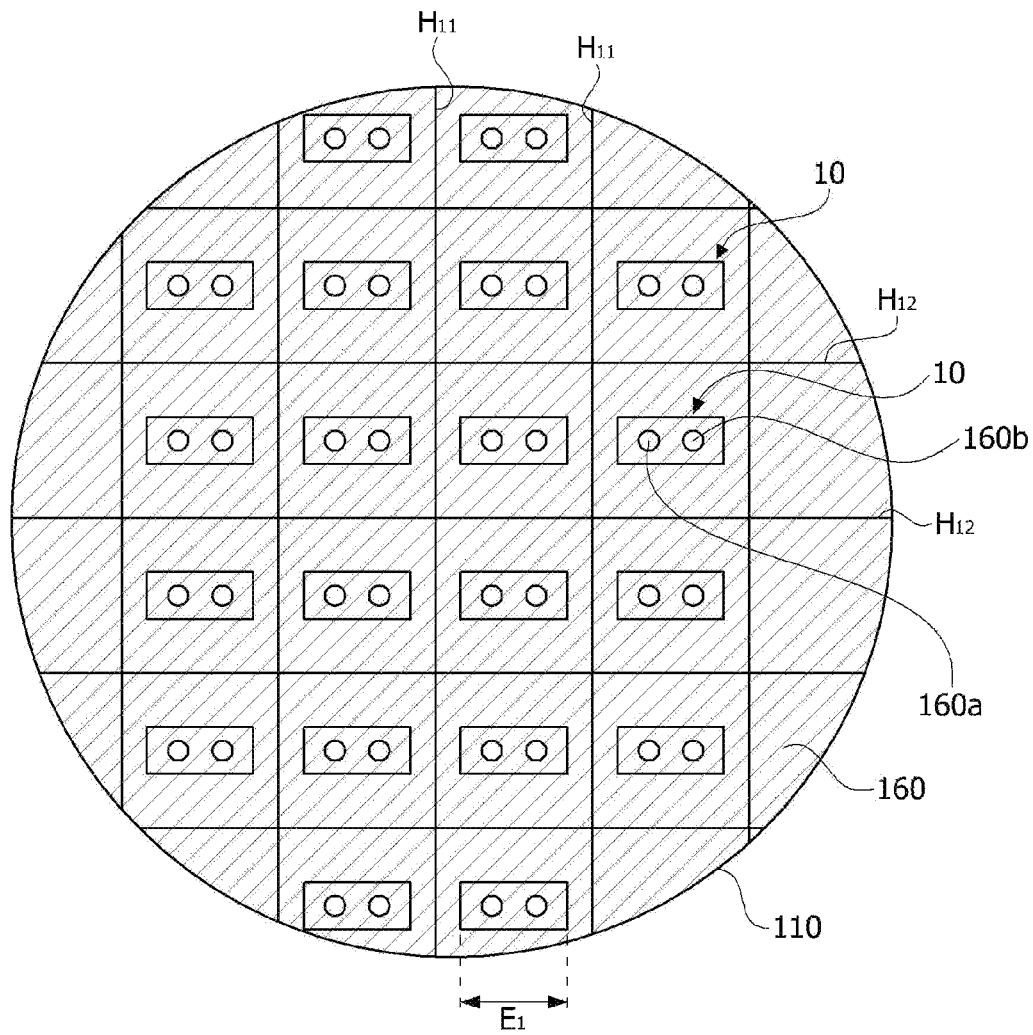
FIG. 6H is a plan view showing a semiconductor device array according to an embodiment of the present invention.

FIG. 6H is a plan view showing a semiconductor device array according to an embodiment of the present invention.

Referring to FIG. 6H, a semiconductor device 10 may have a long side surface E1 and a short side surface when viewed from the top, and the long side surface E1 may have a micro-size smaller than 100 μm. As an example, when the substrate 110 is 5 inches in size, innumerable semiconductor devices may be disposed on the substrate 110.

When viewed from the top, recesses H1 may be disposed to surround one semiconductor device 10. As an example, the recesses H1 may have a first-direction recess H11 and a second-direction recess H12 formed in the shape of a checkerboard. The semiconductor device 10 may be disposed in a space surrounded by the first-direction recess H11 and the second-direction recess H12.

The insulating layer 160 may be disposed on an entirety of the substrate 110 on which the plurality of semiconductor structures are disposed. The insulating layer 160 may be disposed on the first-direction recess H11 and the second-direction recess H12 of the substrate 110. That is, the insulating layer 160 may be entirely disposed in the remaining area excluding holes 160a and 160b for exposing the electrodes of the semiconductor device 10.

FIGS. 7A to 7E are diagrams illustrating a method of transferring a semiconductor device according to an embodiment of the present invention.

Referring to FIGS. 7A to 7E, the method of transferring a semiconductor device according to an embodiment may include selectively emitting laser light to a semiconductor device including a plurality of semiconductor devices disposed on a substrate 110 to separate the semiconductor device from the substrate and placing the separated semiconductor device on a panel substrate. Here, the semiconductor device before the transfer may include the configuration shown in FIG. 6A to 6G.

Figure 7A:
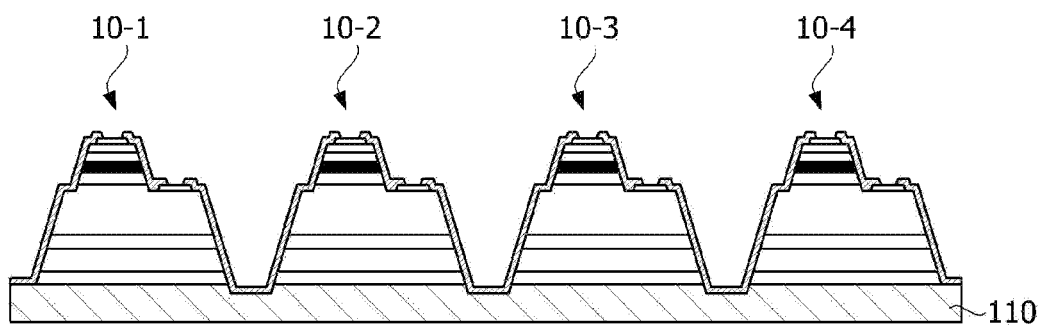
FIGS. 7A to 7E are diagrams illustrating a method of transferring a semiconductor device according to an embodiment of the present invention.

First, referring to FIG. 7A, the substrate 110 may be the same as the substrate 110 that has been described with reference to FIGS. 6A to 6G. Also, as described above, the plurality of semiconductor devices may be disposed on the substrate 110. For example, the plurality of semiconductor devices may include a first semiconductor device 10-1, a second semiconductor device 10-2, a third semiconductor device 10-3, and a fourth semiconductor device 10-4. However, the present invention is not limited thereto, and there may be various numbers of semiconductor devices.

Figure 7B:
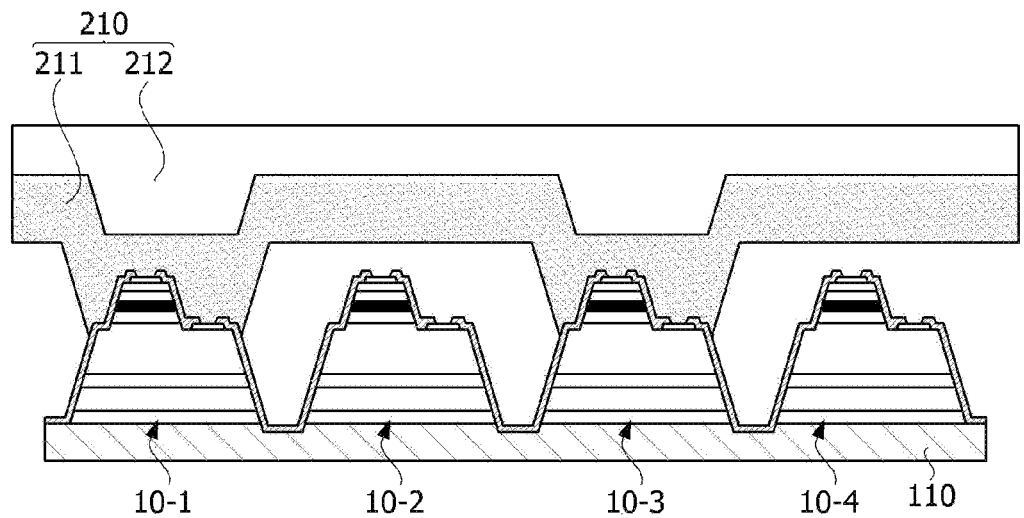

Referring to FIG. 7B, at least one semiconductor device selected from among the plurality of semiconductor devices 10-1, 10-2, 10-3, and 10-4 may be conveyed to a growth substrate by using a conveying mechanism 210. The conveying mechanism 210 may include a first bonding layer 211 and a conveying frame 212 disposed therebelow. As an example, the conveying frame 212 has a concavo-convex structure, and thus it is possible to facilitate bonding between the semiconductor device and the first bonding layer 211. In this case, since the semiconductor device according to this embodiment has a step height smaller than 2 μm, the semiconductor device can remain level during the transfer process.

Figure 7C:
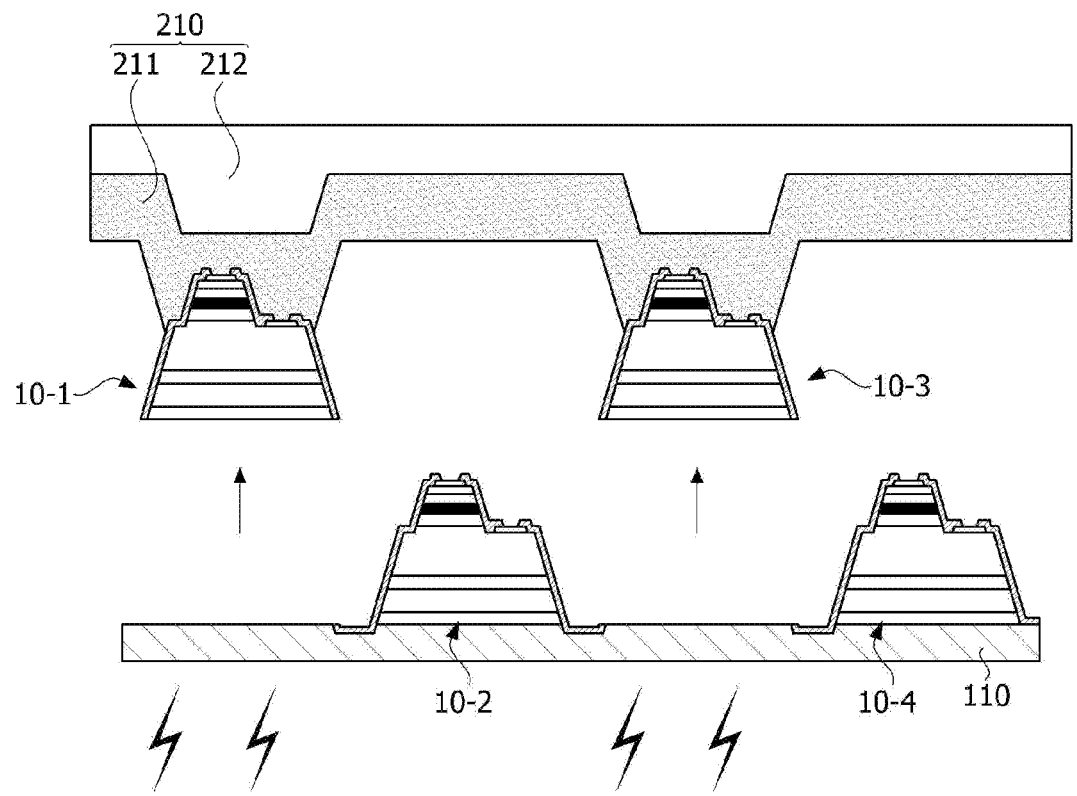

Referring to FIG. 7C, when laser light is selectively emitted to the rear surfaces of the semiconductor devices 10-1 and 10-3 to be separated, the semiconductor devices 10-1 and 10-3 may be separated from the substrate 110 by the sacrificial layers of the semiconductor devices 10-1 and 10-3 being decomposed. Subsequently, the first semiconductor device 10-1 and the third semiconductor device 10-3 may be separated from the conveying mechanism 210 by moving the conveying mechanism 210 upward. Also, the second bonding layer 310 may be disposed between and bonded to the first semiconductor device 10-1 and the second semiconductor device 10-3.

Laser lift-off (LLO) using photon beams of a specific wavelength range may be applied as a method of separating the semiconductor device from the substrate 110. For example, the emitted laser light may have a center wavelength of 266 nm, 532 nm, or 1064 nm, but the present invention is not limited thereto.

In this case, the bonding layer 130 disposed between the semiconductor device and the substrate 110 can prevent physical damage to the semiconductor device caused by laser lift-off (LLO). The sacrificial layer may be separated from the semiconductor device by laser lift-off (LLO). For example, a portion of the sacrificial layer may be removed by the separation, and the remaining portion of the sacrificial layer may be separated along with the coupling layer. Thus, the sacrificial layer, the coupling layer disposed above the sacrificial layer, the semiconductor structure, the first electrode, and the second electrode, which are included in the semiconductor device, may be separated from the substrate 110.

Also, a plurality of semiconductor devices separated from the substrate 110 may be spaced a predetermined distance from one another. As described above, the first semiconductor device 10-1 and the third semiconductor device 10-3 may be separated from the growth substrate, and the second semiconductor device 10-2 and the fourth semiconductor device 10-4 spaced the same separation distance apart as the first semiconductor device 10-1 and the third semiconductor device 10-3 may be separated from the growth substrate in the same way. Thus, semiconductor devices separated by the same separation distance may be transferred to a display panel.

Figure 7D:
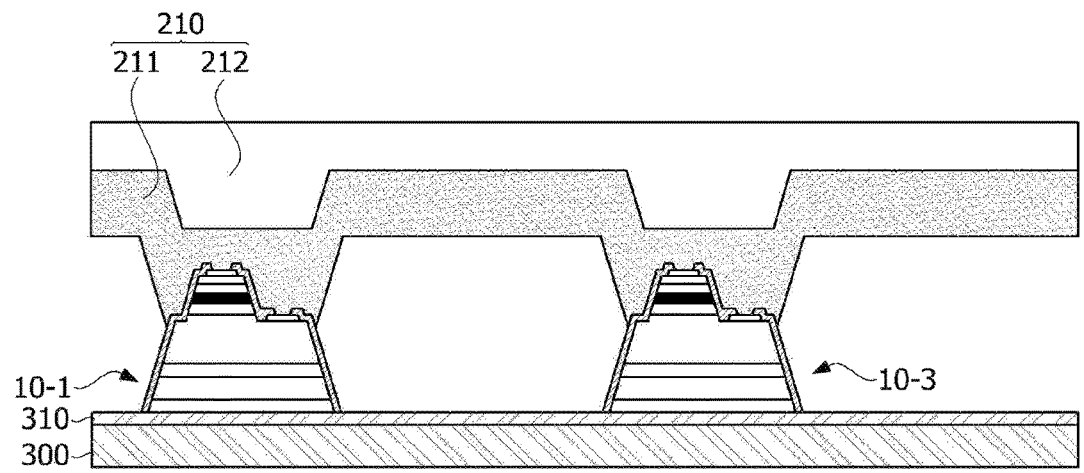

Referring to FIG. 7D, the selected semiconductor device may be disposed on a panel substrate 300. For example, the first semiconductor device 10-1 and the third semiconductor device 10-3 may be disposed on the panel substrate 300.

In detail, the second bonding layer 310 may be disposed on the panel substrate 300, and the first semiconductor device 10-1 and the third semiconductor device 10-3 may be disposed on the second bonding layer 310. Thus, the first semiconductor device 10-1 and the third semiconductor device 10-3 may be bonded to the second bonding layer 310. According to such a method, it is possible to improve efficiency of the transfer process by placing semiconductor devices spaced apart from one another on the panel substrate.

Also, laser light may be emitted to separate the selected semiconductor device from the first bonding layer 211. For example, laser light is upwardly emitted to the conveying mechanism 210 so that the first bonding layer 211 and the selected semiconductor device may be physically separated from each other. For example, the bonding layer 211 may lose an adhesive function when laser light is emitted.

Figure 7E:
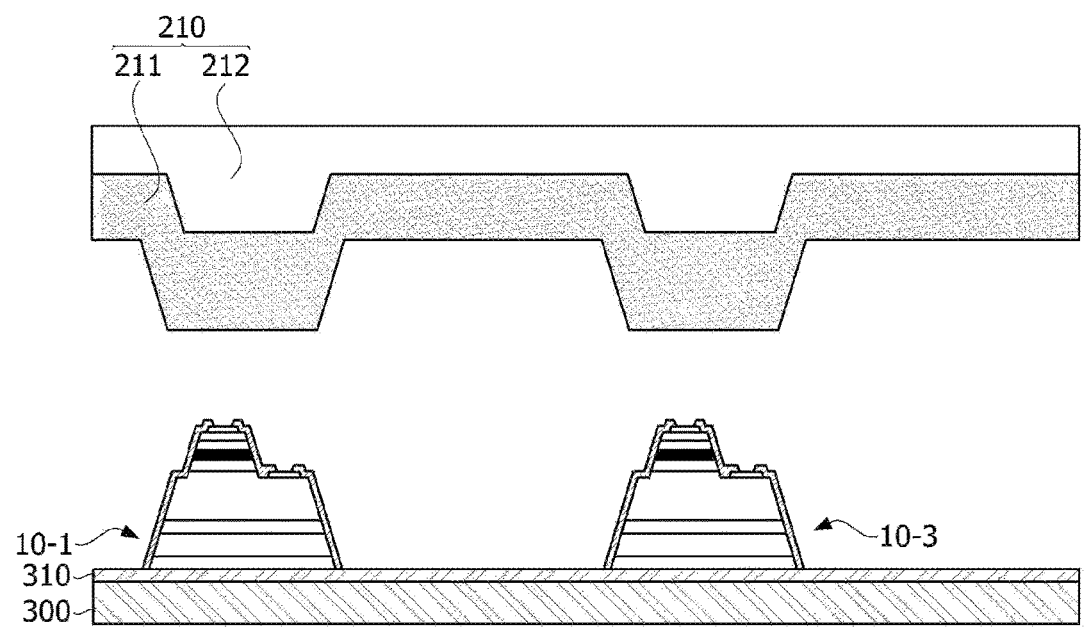

Referring to FIG. 7E, when the conveying mechanism 210 is moved upward after the laser light emission, the first semiconductor device 10-1 and the third semiconductor device 10-3 may be separated from the conveying mechanism 210. Also, the second bonding layer 310 may be disposed between and bonded to the first semiconductor device 10-1 and the second semiconductor device 10-3.

Figure 8A:
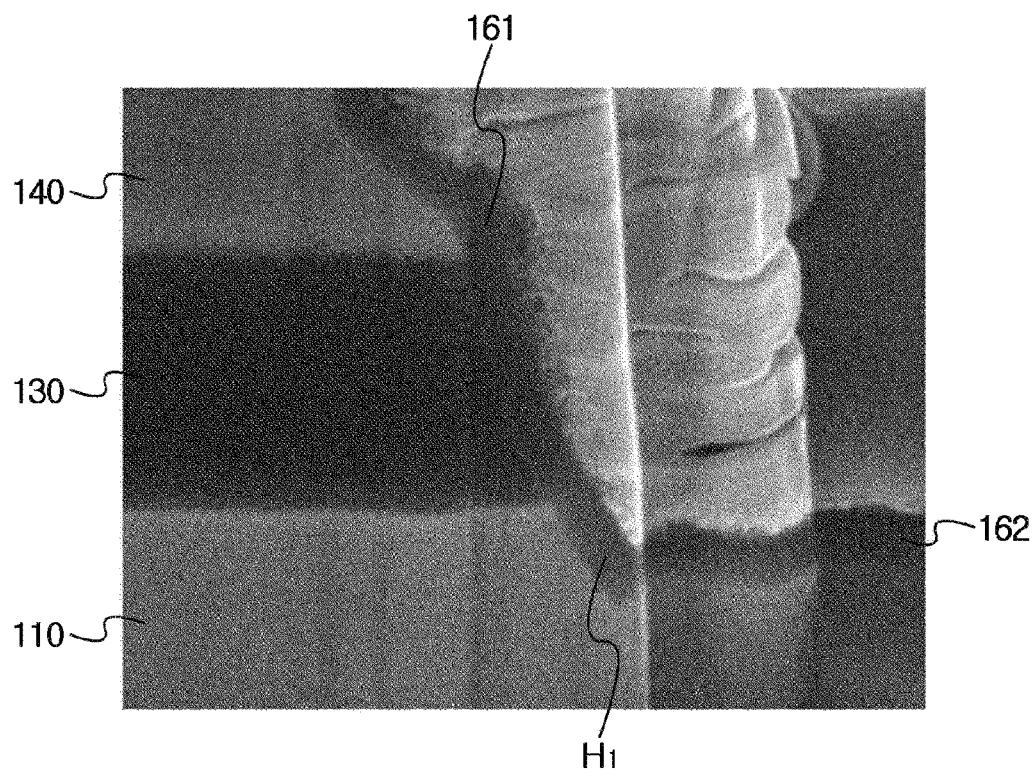
FIG. 8A is a photograph captured before a semiconductor device is separated from a substrate.
Figure 8B:
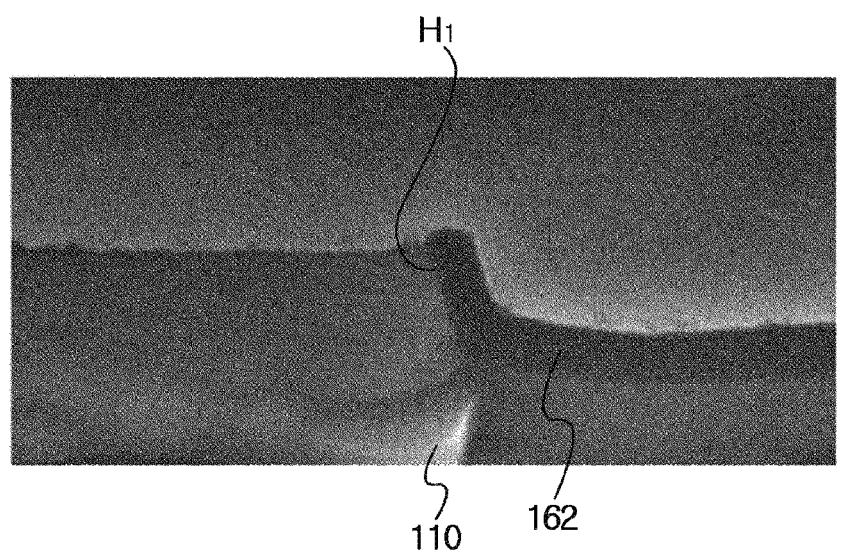
FIG. 8B is a photograph captured after a semiconductor device is separated from a substrate.
Figure 9:
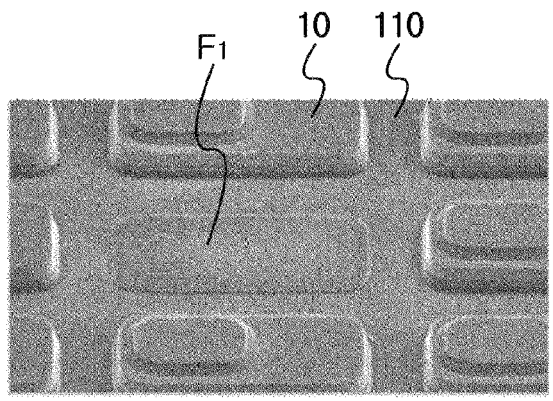
FIG. 9 is a photograph showing that a semiconductor device is cleanly separated from a substrate according to an embodiment of the present invention.

FIG. 8A is a photograph captured before a semiconductor device is separated from a substrate, FIG. 8B is a photograph captured after a semiconductor device is separated from a substrate, and FIG. 9 is a photograph showing that a semiconductor device is cleanly separated from a substrate according to an embodiment of the present invention.

Referring to FIG. 8A, it can be seen that in the case of the semiconductor device according to this embodiment, the first and second insulating layers 161 and 162 are formed on a side surface of the semiconductor structure 140 and the recess H1 of the substrate 110 so that the sacrificial layer 120 is completely separated. Also, as shown in FIG. 8B, it can be seen that when the semiconductor device is partially separated from the substrate 110, only the second insulating layer 162 disposed in the recess H1 remains and the first insulating layer 161 is cleanly separated. Referring to FIG. 9, it can be seen that no particles occur when a sacrificial layer or an insulating layer is separated in a region F1 where the semiconductor device is separated.

Figure 10:
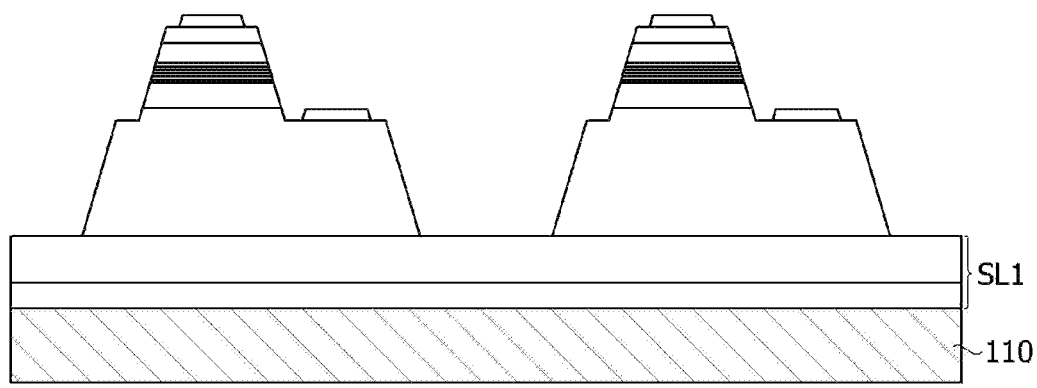
FIG. 10 is a diagram showing a method of separating a semiconductor device without etching a sacrificial layer.
Figure 11:
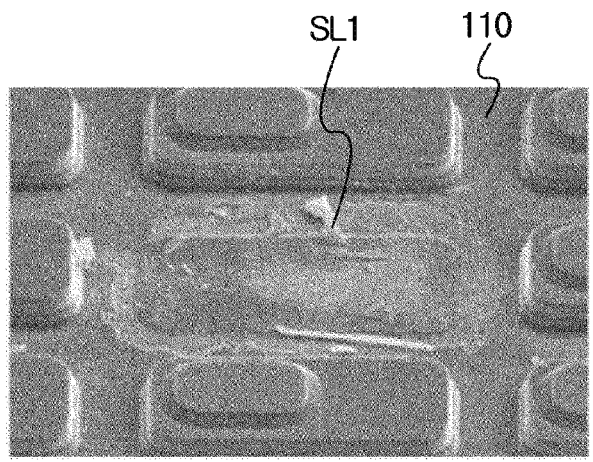
FIG. 11 is a diagram showing that particles remain when a semiconductor device is separated by the method of FIG. 10.

FIG. 10 is a diagram showing a method of separating a semiconductor device without etching a sacrificial layer, and FIG. 11 is a diagram showing that particles remain when a semiconductor device is separated by the method of FIG. 10.

When only a semiconductor structure is etched for a second time and a sacrificial layer SL1 is not etched as shown in FIG. 10, this may affect neighboring devices during a process of separating the semiconductor device.

As an example, when the sacrificial layer SL1 is thick, there is a problem in that the sacrificial layer SL1 of a channel region CH is irregularly separated during a lift-off process. Here, a channel region may be defined as a region between neighboring semiconductor structures.

Also, when the sacrificial layer remains thin in the channel region, particles may be formed when the remaining sacrificial layer SL1 is separated as shown in FIG. 11. The particles may cause defects in the transfer process. Accordingly, according to an embodiment of the present invention, it is possible to prevent such defects by pre-etching the sacrificial layer of the channel region.

Figure 12:
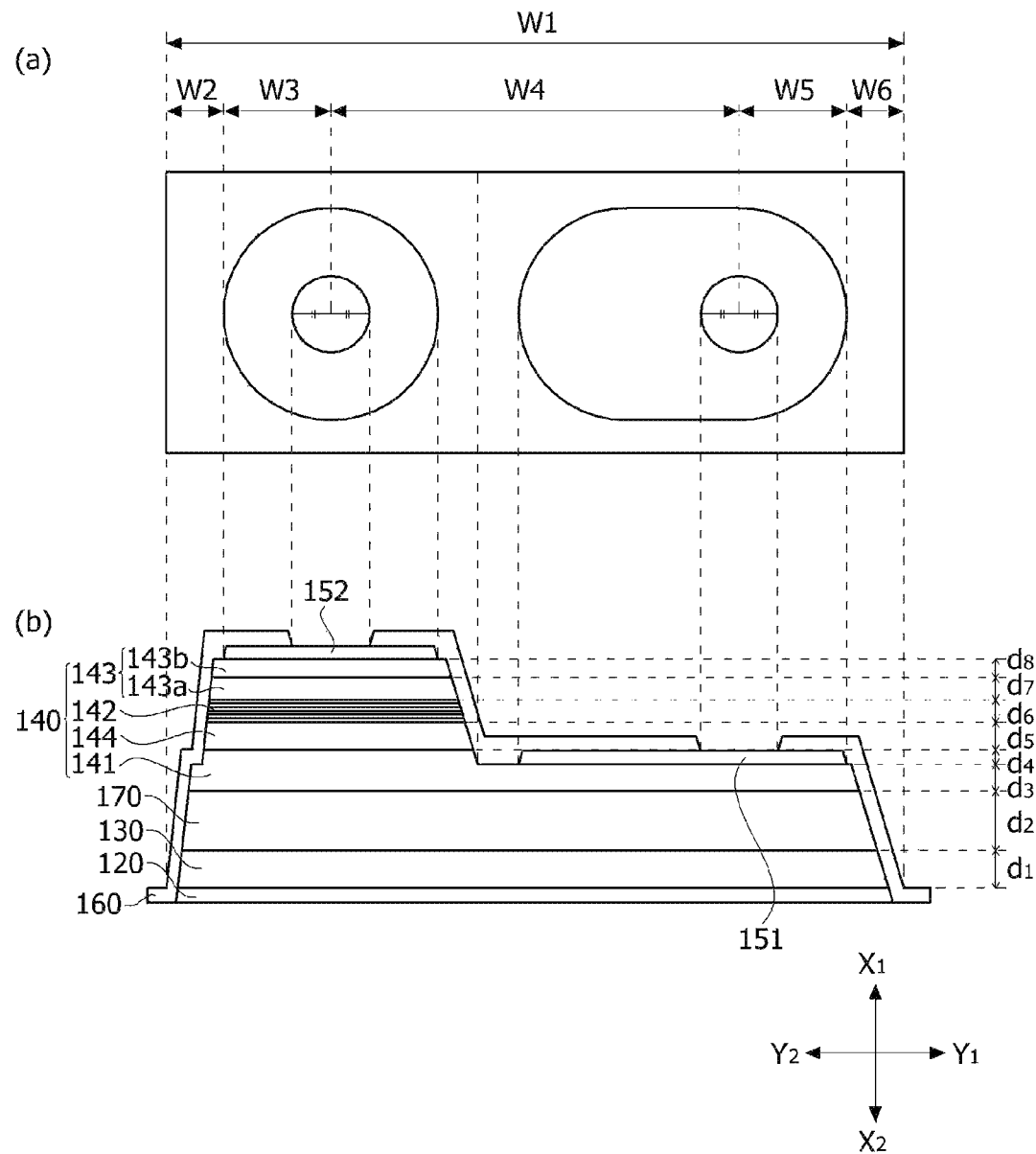
FIG. 12 is a diagram of a semiconductor device according to an embodiment of the present invention.

FIG. 12 is a diagram of a semiconductor device according to an embodiment of the present invention.

Referring to FIG. 12, the semiconductor device according to this embodiment may include a sacrificial layer 120, a coupling layer 130 disposed on the sacrificial layer 120, an intermediate layer 170 disposed on the coupling layer 130, a first conductive semiconductor layer 141 disposed on the intermediate layer 170, a first clad layer 144 disposed on the first conductive semiconductor layer 141, an active layer 142 disposed on the first clad layer 144, a second conductive semiconductor layer 143 disposed on the active layer 142, a first electrode 151 electrically connected to the first conductive semiconductor layer 141, a second electrode 152 electrically connected to the second conductive semiconductor layer 143, and an insulating layer 160 surrounding the sacrificial layer 120, the coupling layer 130, the first conductive semiconductor layer 141, the first clad layer 144, the active layer 142, and the second conductive semiconductor layer 143.

The sacrificial layer 120 may be a layer that is disposed on the bottom of the semiconductor device according to this embodiment. That is, the sacrificial layer 120 may be an outermost layer in a first-second direction (an $X_2$-axis direction). The sacrificial layer 120 may be disposed on a substrate (not shown).

The sacrificial layer 120 may have a maximum width $W_1$ ranging from 30 μm to 60 μm in a second direction (a Y-axis direction).

Here, the first direction is a thickness direction of a semiconductor structure 140 and includes a first-first direction and a first-second direction. The first-first direction of the thickness direction of the semiconductor structure 140 is a direction from the first conductive semiconductor layer 12 to the second conductive semiconductor layer 143. Also, the first-second direction of the thickness direction of the semiconductor structure 140 is a direction from the second conductive semiconductor layer 143 to the first conductive semiconductor layer 12. Also, here, the second direction (the Y-axis direction) may be perpendicular to the first direction (the X-axis direction). Also, the second direction (the Y-axis direction) includes a second-first direction (an $Y_1$-axis direction) and a second-second direction (an $Y_2$-axis direction).

The sacrificial layer 120 may be a layer that remains after the semiconductor device is transferred to a display apparatus. For example, when the semiconductor device is transferred to the display apparatus, a portion of the sacrificial layer 120 may be separated from the semiconductor device by laser light emitted during the transfer, and a portion that is not separated may remain. In this case, the sacrificial layer 120 may contain a material that is separable at the wavelength of the emitted laser light. Also, the wavelength of the laser light may be any one of 266 nm, 532 nm, and 1064 nm, but the present invention is not limited thereto.

The sacrificial layer 120 may contain an oxide or a nitride. However, the present invention is not limited thereto. For example, the sacrificial layer 120 may contain an oxide-based material, which is a material that is less deformed during epitaxial growth.

The sacrificial layer 120 may contain at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf.

The sacrificial layer 120 may have a thickness $d_1$ greater than or equal to 20 nm in the first direction (the X-axis direction). Preferably, the thickness $d_1$ of the sacrificial layer 120 in the first direction (the X-axis direction) may be greater than or equal to 40 nm.

The sacrificial layer 120 may be formed by e-beam evaporation, thermal evaporation, metal-organic chemical vapor deposition (MOCVD), or sputtering and pulsed laser deposition (PLD), but the present invention is not limited thereto.

The coupling layer 130 may be disposed on the sacrificial layer 120. The coupling layer 130 may contain a material such as $SiO_2$, $SiN_x$, $TiO_2$, polyimide, and a resin.

The coupling layer 130 may have a thickness $d_2$ of 30 nm to 1 μm. However, the present invention is not limited thereto. Here, the thickness may be a length in the X-axis direction. The coupling layer 130 may be annealed to bond the sacrificial layer 120 to the intermediate layer 170. In this case, hydrogen ions are discharged from the coupling layer 130, and thus delamination may occur. Thus, the coupling layer 130 may have a surface roughness of 1 nm or less. According to such a configuration, it is possible to facilitate bonding between a separation layer and a coupling layer. The positions of the coupling layer 130 and the sacrificial layer 120 may be switched with each other.

The intermediate layer 170 may be disposed on the coupling layer 130. The intermediate layer 170 may contain GaAs. The intermediate layer 170 may be coupled to the sacrificial layer 120 through the coupling layer 130.

The semiconductor structure 140 may be disposed on the intermediate layer 170. The semiconductor structure 140 may include the first conductive semiconductor layer 141 disposed on the intermediate layer 170, the first clad layer 144 disposed on the first conductive semiconductor layer 141, the active layer 142 disposed on the first clad layer 144, and the second conductive semiconductor layer 143 disposed on the active layer 142.

The first conductive semiconductor layer 141 may be disposed on the intermediate layer 170. The first conductive semiconductor layer 141 may have a thickness $d_4$ of 1.8 μm to 2.2 μm. However, the present invention is not limited thereto.

The first conductive semiconductor layer 141 may be made of a group III-V or group II-VI compound semiconductor and may be doped with first dopants. The first conductive semiconductor layer 141 may contain a semiconductor material having an empirical formula $In_xAl_yGa_{1-x-y}P$ ($0 \leq x \leq 1$, $0 \leq y \leq 1$, and $0 \leq x+y \leq 1$) or $In_xAl_yGa_{1-x-y}N$ ($0 \leq x \leq 1$, $0 \leq y \leq 1$, and $0 \leq x+y \leq 1$).

Also, the first dopants may be n-type dopants such as Si, Ge, Sn, Se, and Te. When the first dopants are n-type dopants, the first conductive semiconductor layer 141 doped with the first dopants may be an n-type semiconductor layer.

The first conductive semiconductor layer 141 may contain any one or more of AlGaP, InGaP, AlInGaP, InP, GaN, InN, AlN, InGaN, AlGaN, InAlGaN, AlInN, AlGaAs, InGaAs, AlInGaAs, and GaP.

The first conductive semiconductor layer 141 may be formed by chemical vapor deposition (CVD), molecular beam epitaxy (MBE), sputtering or hydride vapor phase epitaxy (HVPE), or the like, but the present invention is not limited thereto.

The first clad layer 144 may be disposed on the first conductive semiconductor layer 141. The first clad layer 144 may be disposed between the first conductive semiconductor layer 141 and the active layer 142. The first clad layer 144 may include a plurality of layers. The first clad layer 144 may include an AlInP-based layer/AlInGaP-based layer.

The first clad layer 144 has a thickness $d_5$ of 0.45 μm to 0.55 μm. However, the present invention is not limited thereto.

The active layer 142 may be disposed on the first clad layer 144. The active layer 142 may be disposed between the first conductive semiconductor layer 141 and the second conductive semiconductor layer 143. The active layer 142 is a layer in which electrons (or holes) injected through the first conductive semiconductor layer 141 are combined with holes (or electrons) injected through the second conductive semiconductor layer 143. Electrons and holes may transition to a lower energy level due to electron-hole recombination and thus the active layer 142 may generate ultraviolet wavelength light.

The active layer 142 may have, but is not limited to, any one of a single-well structure, a multi-well structure, a single-quantum-well structure, a multi-quantum-well (MQW) structure, a quantum dot structure, or a quantum wire structure.

The active layer 142 may be formed as a paired structure of one or more of GaInP/AlGaInP, GaP/AlGaP, InGaP/AlGaP, InGaN/GaN, InGaN/InGaN, GaN/AlGaN, InAlGaN/GaN, GaAs/AlGaAs, and InGaAs/AlGaAs, but the present invention is not limited thereto.

The active layer 142 may have a thickness $d_6$ of 0.54 μm to 0.66 μm. However, the present invention is not limited thereto.

Since electrons are cooled in the first clad layer 144, the active layer 142 may generate more radiation recombination.

The second conductive semiconductor layer 143 may be disposed on the active layer 142. The second conductive semiconductor layer 143 may include a second-first conductive semiconductor layer 143a and a second-second conductive semiconductor layer 143b.

The second-first conductive semiconductor layer 143a may be disposed on the active layer 142. The second-second conductive semiconductor layer 143b may be disposed on the second-first conductive semiconductor layer 143a.

The second-first conductive semiconductor layer 143a may contain TSBR and P—AlInP. The second-first conductive semiconductor layer 143a may have a thickness $d_7$ of 0.57 μm to 0.70 μm. However, the present invention is not limited thereto.

The second-first conductive semiconductor layer 143a may be made of a group III-V or group II-VI compound semiconductor. The second-first conductive semiconductor layer 143a may be doped with second dopants.

The second-first conductive semiconductor layer 143a may contain a semiconductor material having an empirical formula $In_xAl_yGa_{1-x-y}P$ ($0 \leq x \leq 1$, $0 \leq y \leq 1$, and $0 \leq x+y \leq 1$) or $In_xAl_yGa_{1-x-y}N$ ($0 \leq x \leq 1$, $0 \leq y \leq 1$, and $0 \leq x+y \leq 1$). When the second conductive semiconductor layer 143 is a p-type semiconductor layer, the second conductive semiconductor layer 143 may contain Mg, Zn, Ca, Sr, Ba or the like as p-type dopants.

The second-first conductive semiconductor layer 143a doped with second dopants may be a p-type semiconductor layer.

The second-second conductive semiconductor layer 143b may be disposed on the second-first conductive semiconductor layer 143a. The second-second conductive semiconductor layer 143b may include a p-type GaP-based layer.

The second-second conductive semiconductor layer 143b may include a superlattice structure of a GaP layer/$In_xGa_{1-x}P$ layer ($0 \leq x \leq 1$).

For example, the second-second conductive semiconductor layer 143b may be doped with Mg at a concentration of about $10 \times 10^{-18}$, but the present invention is not limited thereto.

Also, the second-second conductive semiconductor layer 143b may include a plurality of layers, only some of which may be doped with Mg.

The second-second conductive semiconductor layer 143b may have a thickness $d8$ of 0.9 μm to 1.1 μm. However, the present invention is not limited thereto.

The first electrode 151 may be disposed on the first conductive semiconductor layer 141. The first electrode 151 may be electrically connected to the first conductive semiconductor layer 141.

The first electrode 151 may be disposed on a portion of an upper surface of the first conductive semiconductor layer 141 in which mesa-etching is performed. Thus, the first electrode 151 may be disposed below the second electrode 152 which is disposed on top of the second conductive semiconductor layer 143.

A minimum width $W_2$ in the second-second direction (the $Y_2$-axis direction) between the second electrode 152 and an edge of the insulating layer 160 in the second-second direction (the $Y_2$-axis direction) may range from 2.5 μm to 3.5 μm. Likewise, a minimum width $W_6$ in the second-first direction (the $Y_1$-axis direction) between the first electrode 151 and an edge of the insulating layer 160 in the second-first direction (the $Y_1$-axis direction) may range from 2.5 μm to 3.5 μm. However, the present invention is not limited thereto.

The first electrode 151 may contain, but is not limited to, at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf.

Any electrode formation methods that are typically used, such as sputtering, coating, and deposition, may be applied to the first electrode 151.

As described above, the second electrode 152 may be disposed on the second-second conductive semiconductor layer 143b. The second electrode 152 may be electrically connected to the second-second conductive semiconductor layer 143b.

The second electrode 152 may contain, but is not limited to, at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, $Ni/IrO_x$/Au, $Ni/IrO_x$/Au/ITO, Ag, Ni, Cr, Ti, Al, Rh, Pd, Ir, Sn, In, Ru, Mg, Zn, Pt, Au, and Hf.

Any electrode formation methods that are typically used, such as sputtering, coating, and deposition, may be applied to the second electrode 152.

Also, the first electrode 151 may have a greater width in the second direction (the Y-axis direction) than the second electrode 152. However, the present invention is not limited thereto.

The insulating layer 160 may cover the sacrificial layer 120, the coupling layer 130, and the semiconductor structure 140. The insulating layer 160 may cover side surfaces of the sacrificial layer 120 and the coupling layer 130. The insulating layer 160 may cover a portion of the upper surface of the first electrode 151. According to such a configuration, the first electrode 151 is electrically connected to an electrode or pad through an exposed portion of the upper surface so that electric current may be injected into the first electrode 151. Like the first electrode 151, the second electrode 152 may include an exposed upper surface. The insulating layer 160 covers the sacrificial layer 120 and the coupling layer 130 so that the sacrificial layer 120 and the coupling layer 130 may not be exposed to the outside.

The insulating layer 160 may cover a portion of the upper surface of the first electrode 151. Also, the insulating layer 160 may cover a portion of an upper surface of the second electrode 152. A portion of the upper surface of the first electrode 151 may be exposed. A portion of the upper surface of the second electrode 152 may be exposed.

The exposed portion of the upper surface of the first electrode 151 and the exposed portion of the upper surface of the second electrode 152 may have circular shapes, but the present invention is not limited thereto. Also, a distance $W_4$ in the second direction (the Y-axis direction) between a center point of the exposed portion of the upper surface of the first electrode 151 and a center point of the exposed portion of the upper surface of the second electrode 152 may range from 20 μm to 30 μm. Here, the center points refer to points that bisect the widths of the portions of the first electrode and the second electrode exposed in the second direction (the Y-axis direction).

A maximum width $W_5$ in the second-first direction (the $Y_1$-axis direction) between the center point of the exposed portion of the first electrode 151 and an edge of the first electrode 151 in the second-first direction (the $Y_1$-axis direction) may range from 5.5 μm to 7.5 μm. Also, a maximum width $W_6$ in the second-second direction (the $Y_2$-axis direction) between an edge of the second electrode 152 in the second-second direction (the $Y_2$-axis direction) and the center point of the exposed portion of the second electrode 152 may range from 5.5 μm to 7.5 μm. However, the present invention is not limited thereto.

In the semiconductor structure 140, the insulating layer 160 may electrically separate the first conductive semiconductor layer 141 from the second conductive semiconductor layer 143. The insulating layer 160 may be formed of at least one material selected from a group consisting of $SiO_2$, $Si_xO_y$, $Si_3N_4$, $Si_xN_y$, $SiO_xN_y$, $Al_2O_3$, $TiO_2$, and AlN, but the present invention is not limited thereto.

Figure 13:
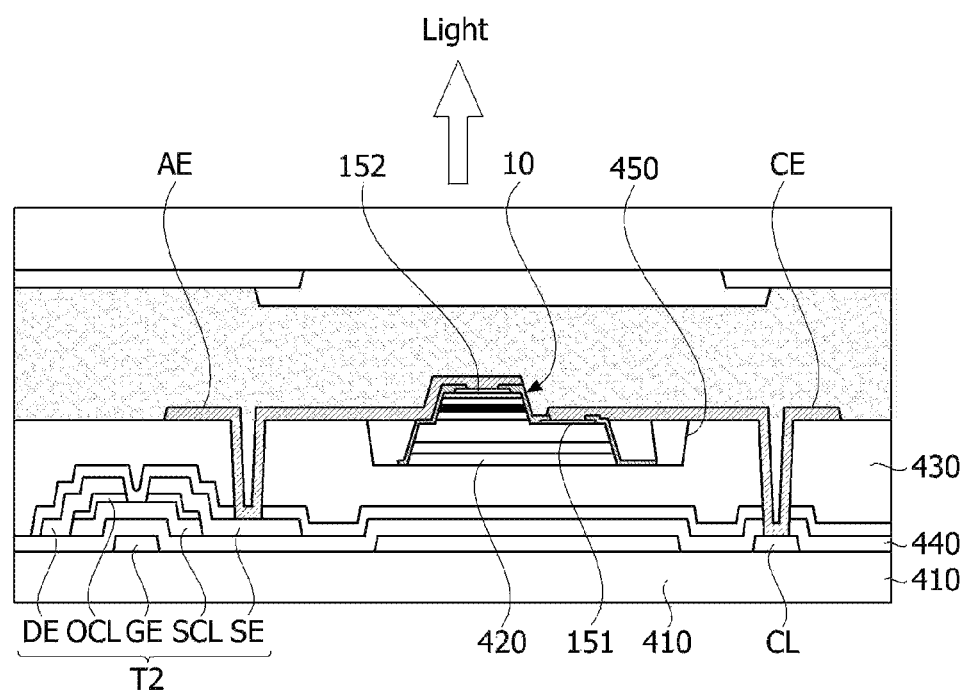
FIG. 13 is a conceptual view of a display apparatus to which a semiconductor device is transferred according to an embodiment.

FIG. 13 is a conceptual view of a display apparatus to which a semiconductor device is transferred according to an embodiment.

Referring to FIG. 13, the display apparatus including a semiconductor device according to an embodiment may include a second panel substrate 410, a driving thin-film transistor T2, a planarization layer 430, a common electrode CE, a pixel electrode AE, and a semiconductor device 10.

The driving thin-film transistor T2 includes a gate electrode GE, a semiconductor layer SCL, an ohmic contact layer OCL, a source electrode SE, and a drain electrode DE.

The driving thin-film transistor, which is a driving device, may be electrically connected to the semiconductor device to drive the semiconductor device.

The gate electrode GE may be formed along with a gate line. The gate electrode GE may be covered with a gate insulating layer 440.

The gate insulating layer 440 may include a single layer or a plurality of layers which are made of an inorganic material and may be made of a silicon oxide ($SiO_x$), a silicon nitride ($SiN_x$), or the like.

The semiconductor layer SCL may be disposed on the gate insulating layer 440 in the form of a predetermined pattern (or island) to overlap with the gate electrode GE. The semiconductor layer SCL may be made of a semiconductor material formed of any one of amorphous silicon, polycrystalline silicon, an oxide, and an organic material, but the present invention is not limited thereto.

The ohmic contact layer OCL may be disposed on the semiconductor layer SCL in the form of a predetermined pattern (or island). The ohmic contact layer PCL may be for ohmic contact between the semiconductor layer SCL and the source and drain electrodes SE and DE.

The source electrode SE may be formed on one side of the ohmic contact layer OCL to overlap with the other side of the semiconductor layer SCL.

The drain electrode DE may be formed on the other side of the ohmic contact layer OCL to overlap with the other side of the semiconductor layer SCL and spaced apart from the source electrode SE. The drain electrode DE may be formed along with the source electrode SE.

A planarization film may be disposed on the entire surface of the second panel substrate 410. The driving thin-film transistor T2 may be disposed inside the planarization film. As an example, the planarization film may contain an organic material such as benzocyclobutene or photoacryl, but the present invention is not limited thereto.

A groove 450 is a predetermined light-emitting region, and the semiconductor device may be disposed on the groove 450. Here, the light-emitting region may be defined as the remaining region excluding a circuit region in the display apparatus.

The groove 450 may be formed to be concave with respect to the planarization layer 430, but the present invention is not limited thereto.

The semiconductor device may be disposed on the groove 450. The semiconductor device may have a first electrode and a second electrode connected to a circuit (not shown) of the display apparatus.

The semiconductor device may be adhered to the groove 450 through an adhesive layer 420. Here, the adhesive layer 420 may be the aforementioned second bonding layer, but the present invention is not limited thereto.

The second electrode 152 of the semiconductor device may be electrically connected to the source electrode SE of the driving thin-film transistor T2 through the pixel electrode AE. Also, the first electrode 151 of the semiconductor device may be connected to a common power line CL through the common electrode CE.

The first and second electrodes 151 and 152 may have different heights, and the first electrode 151, which is placed at a relatively low position, may be positioned level with an upper surface of the planarization layer 430. However, the present invention is not limited thereto.

The pixel electrode AE may electrically connect the second electrode of the semiconductor device to the source electrode SE of the driving thin-film transistor T2.

The common electrode CE may electrically connect the first electrode of the semiconductor device to the common power line CL.

Each of the pixel electrode AE and the common electrode CE may contain a transparent conductive material. The transparent conductive material may include a material such as indium tin oxide (ITO) or indium zinc oxide (IZO), but the present invention is not limited thereto.

The display apparatus according to an embodiment of the present invention may be implemented to have Standard Definition (SD) resolution (760×480), High Definition (HD) resolution (1180×720), Full HD (FHD) resolution (1920×1080), Ultra HD (UHD) resolution (3480×2160), or UHD or higher resolution (e.g., 4K (K=1000), 8K, etc.). In this case, a plurality of such semiconductor devices according to an embodiment may be arranged and connected to one another depending on the resolution.

Also, the display apparatus may be a TV or a display panel with a diagonal size of 100 inches or more, and pixels may be implemented as light-emitting diodes (LEDs). Accordingly, the display apparatus may have low power consumption, low maintenance cost, and a long lifespan and may be provided as a high-brightness self-luminous display.

According to an embodiment, the display apparatus has high color purity and color reproduction because videos and images are realized using the semiconductor device.

According to an embodiment, the display apparatus may be implemented as a 100 inch or larger display apparatus capable of providing clear pictures because videos and images are realized by using a light-emitting device package of which optical straightness is high.

According to an embodiment, it is possible to implement a 100 inch or larger display apparatus with high definition at low cost.

The semiconductor device according to an embodiment may additionally include an optical member such as a light guide plate, a prism sheet, and a diffusion sheet and thus may function as a backlight unit. Also, the semiconductor device according to an embodiment may also be applied to a display apparatus, a lighting apparatus, and an indicating apparatus.

In this case, the display apparatus may include a bottom cover, a reflective plate, a light-emitting module, a light guide plate, an optical sheet, a display panel, a picture signal output circuit, and a color filter. The bottom cover, the reflective plate, the light-emitting module, the light guide plate, and the optical sheet may constitute a backlight unit.

The reflective plate is placed on the bottom cover, and the light-emitting module emits light. The light guide plate is disposed in front of the reflective plate to guide light emitted by the light-emitting module forward. The optical sheet includes a prism sheet or the like and is disposed in front of the light guide plate. The display panel is disposed in front of the optical sheet. The picture signal output circuit supplies a picture signal to the display panel. The color filter is disposed in front of the display panel.

Also, the lighting apparatus may include a light source module including a substrate and a semiconductor device of an embodiment, a heat dissipation unit configured to dissipate heat of the light source module, and a power supply unit configured to process or convert an electrical signal received from the outside and provide the electrical signal to the light source module. Furthermore, the lighting apparatus may include a lamp, a headlamp, or a streetlight.

Also, a camera flash of a mobile terminal may include a light source module including a semiconductor device of an embodiment.

While the present invention has been described with reference to embodiments, these are just examples and do not limit the present invention. It will be understood by those skilled in the art that various modifications and applications may be made therein without departing from the essential characteristics of the embodiments. For example, elements described in the embodiments above in detail may be modified and implemented. Furthermore, differences associated with such modifications and applications should be construed as being included in the scope of the present invention defined by the appended claims.

The invention claimed is:

1. A semiconductor device comprising:
a semiconductor structure comprising a first semiconductor layer, a second semiconductor layer, and an active layer disposed between the first semiconductor layer and the second semiconductor layer;
a first electrode electrically connected to the first semiconductor layer; and
a second electrode electrically connected to the second semiconductor layer,
wherein,
the semiconductor structure comprises a first upper surface on which the first semiconductor layer is exposed, a second upper surface on which the second semiconductor layer is disposed, an inclined surface connecting the first upper surface and the second upper surface, and a recess formed between the first upper surface and the inclined surface, and
the recess has a depth less than or equal to 30% of a vertical distance between the first upper surface and the second upper surface, and
wherein a ratio of a first vertical height from a bottom surface of the semiconductor structure to the second upper surface to a second vertical height from the bottom surface of the semiconductor structure to the first upper surface ranges from 1:0.6 to 1:0.95.

2. The semiconductor device of claim 1, wherein the first vertical height and the second vertical height have a difference of less than 2 μm.

3. The semiconductor device of claim 1, wherein a first angle between a horizontal surface and the inclined surface is smaller than a second angle between the horizontal surface and a side surface of the semiconductor structure.

4. The semiconductor device of claim 3, wherein the first angle ranges from 20° to 80°, and the second angle ranges from 70° to 90°.

5. The semiconductor device of claim 3, wherein the semiconductor structure comprises a long side surface and a short side surface in plane, and
wherein the long side surface is smaller than 100 μm.

6. The semiconductor device of claim 1, wherein a width of the inclined surface decreases away from the first upper surface.

7. A semiconductor device comprising:
a semiconductor structure comprising a first semiconductor layer, a second semiconductor layer, and an active layer disposed between the first semiconductor layer and the second semiconductor layer;

a first electrode electrically connected to the first semiconductor layer; and
a second electrode electrically connected to the second semiconductor layer,
wherein,
the semiconductor structure comprises a first upper surface on which the first semiconductor layer is exposed, a second upper surface on which the second semiconductor layer is disposed, an inclined surface connecting the first upper surface and the second upper surface, and a recess formed between the first upper surface and the inclined surface, and
the recess has a depth less than or equal to 30% of a vertical distance between the first upper surface and the second upper surface, and
wherein,
the second semiconductor layer comprises a first sub-semiconductor layer exposed from the first upper surface and a second sub-semiconductor layer disposed on the first sub-semiconductor layer, and
a difference in etching rate between the first sub-semiconductor layer and the second sub-semiconductor layer is less than or equal to 30% under the same etching conditions.

8. The semiconductor device of claim 7, wherein the first sub-semiconductor layer has a higher etching rate than the second sub-semiconductor layer.

9. The semiconductor device of claim 7, wherein,
the first sub-semiconductor layer contains GaAs, and
the second sub-semiconductor layer contains AlInP.

10. The semiconductor device of claim 9, wherein,
the first sub-semiconductor layer further contains In, and
the first sub-semiconductor layer has a higher In composition than the second sub-semiconductor layer.

11. The semiconductor device of claim 7, wherein the first sub-semiconductor layer and the second sub-semiconductor layer have the same composition.

12. A display device comprising:
a panel substrate; and
a plurality of semiconductor devices disposed on the panel substrate,
wherein the plurality of semiconductor devices comprises:
a semiconductor structure comprising a first semiconductor layer, a second semiconductor layer, and an active layer disposed between the first semiconductor layer and the second semiconductor layer;
a first electrode electrically connected to the first semiconductor layer; and
a second electrode electrically connected to the second semiconductor layer,
wherein,
the semiconductor structure comprises a first upper surface on which the first semiconductor layer is exposed, a second upper surface on which the second semiconductor layer is disposed, an inclined surface connecting the first upper surface and the second upper surface, and a recess formed between the first upper surface and the inclined surface, and
the recess has a depth less than or equal to 30% of a vertical distance between the first upper surface and the second upper surface, and
wherein a ratio of a first vertical height from a bottom surface of the semiconductor structure to the second upper surface to a second vertical height from the bottom surface of the semiconductor structure to the first upper surface ranges from 1:0.6 to 1:0.95.

13. The display device of claim 12, wherein,
the second semiconductor layer comprises a first sub-semiconductor layer exposed from the first upper surface and a second sub-semiconductor layer disposed on the first sub-semiconductor layer, and
a difference in etching rate between the first sub-semiconductor layer and the second sub-semiconductor layer is less than or equal to 30% under the same etching conditions.

14. The display device of claim 13, wherein the first sub-semiconductor layer has a higher etching rate than the second sub-semiconductor layer.

15. The display device of claim 13, wherein,
the first sub-semiconductor layer contains GaAs, and
the second sub-semiconductor layer contains AlInP.

16. The display device of claim 15, wherein,
the first sub-semiconductor layer further contains In, and
the first sub-semiconductor layer has a higher In composition than the second sub-semiconductor layer.

17. The display device of claim 13, wherein the first sub-semiconductor layer and the second sub-semiconductor layer have the same composition.

18. The display device of claim 12, wherein the first vertical height and the second vertical height have a difference of less than 2 μm.

19. The display device of claim 12, wherein a first angle between a horizontal surface and the inclined surface is smaller than a second angle between the horizontal surface and a side surface of the semiconductor structure.

20. The display device of claim 12, wherein the semiconductor structure comprises a long side surface and a short side surface in plane, and
wherein the long side surface is smaller than 100 μm.

* * * * *